US008898971B2

(12) United States Patent
West et al.

(10) Patent No.: US 8,898,971 B2
(45) Date of Patent: Dec. 2, 2014

(54) PHOTOVOLTAIC ARRAY MOUNTING APPARATUS, SYSTEMS, AND METHODS

(71) Applicants: John Raymond West, San Rafael, CA (US); Brian Atchley, San Rafael, CA (US); Tyrus Hawkes Hudson, San Rafael, CA (US); Emil Johansen, San Rafael, CA (US)

(72) Inventors: John Raymond West, San Rafael, CA (US); Brian Atchley, San Rafael, CA (US); Tyrus Hawkes Hudson, San Rafael, CA (US); Emil Johansen, San Rafael, CA (US)

(73) Assignee: Zep Solar, LLC, San Rafael, CA (US)

( * ) Notice: Subject to any disclaimer, the term of this patent is extended or adjusted under 35 U.S.C. 154(b) by 0 days.

(21) Appl. No.: 14/137,989

(22) Filed: Dec. 20, 2013

(65) Prior Publication Data

US 2014/0174511 A1    Jun. 26, 2014

Related U.S. Application Data

(60) Provisional application No. 61/740,410, filed on Dec. 20, 2012.

(51) Int. Cl.
*E04D 13/18*    (2014.01)
*H01L 31/042*    (2014.01)
*H01L 31/18*    (2006.01)

(52) U.S. Cl.
CPC ............ *H01L 31/0422* (2013.01); *H01L 31/18* (2013.01)

USPC .......... 52/173.3; 52/489.1; 52/489.2; 52/768; 52/769; 52/775; 52/747.1

(58) Field of Classification Search
CPC .............. E04D 5/00; E04D 13/00; F24J 2/52; H01L 31/0422
USPC .......... 52/173.3, 489.1, 489.2, 764, 768, 769, 52/773–775, 747.1
See application file for complete search history.

(56) References Cited

U.S. PATENT DOCUMENTS

| | | | |
|---|---|---|---|
| 3,296,763 A | 1/1967 | Curl | |
| 8,701,372 B2 * | 4/2014 | Nuernberger et al. | ........ 52/747.1 |
| 2012/0223032 A1 * | 9/2012 | Rothschild et al. | .......... 211/41.1 |

* cited by examiner

*Primary Examiner* — William Gilbert
*Assistant Examiner* — Patrick Maestri
(74) *Attorney, Agent, or Firm* — Larry D. Johnson

(57) ABSTRACT

An apparatus for mounting a photovoltaic (PV) module on a surface, including a support with an upper surface, a lower surface, tabs, one or more openings, and a clip comprising an arm and a notch, where the apparatus resists wind forces and seismic forces and creates a grounding electrical bond between the PV module, support, and clip. The invention further includes a method for installing PV modules on a surface that includes arranging supports in rows along an X axis and in columns along a Y axis on a surface such that in each row the distance between two neighboring supports does not exceed the length of the longest side of a PV module and in each column the distance between two neighboring supports does not exceed the length of the shortest side of a PV module.

21 Claims, 30 Drawing Sheets

DETAIL B

DETAIL A

DETAIL A

PHOTOVOLTAIC ARRAY MOUNTING APPARATUS, SYSTEMS, AND METHODS

CROSS REFERENCES

The present application claims the benefit of the filing date of U.S. Provisional Patent Application Ser. No. 61/740,410 filed Dec. 20, 2012. The foregoing application is incorporated by reference in its entirety as if fully set forth herein.

GOVERNMENT INTEREST

The present application was made pursuant to U.S. Department of Energy Grant DE-EE0005439. The government may have certain rights in this invention.

BACKGROUND

Photovoltaic (PV) arrays are formed by mechanically linking together PV modules into an array. Most PV module mounting and grounding systems require the time-consuming use of multiple small fasteners. High part count and slow installation time is a major barrier to reducing PV system costs and adoption. Some attempts have been made to reduce PV system costs and adoption. However, these systems suffer from a number of drawbacks. For example, known mounting and grounding devices require a special flange on the outside of the PV module frame and/or require specially designed tools for installation. Other mounting and grounding systems are not compatible with different types of roofs or structures. Other mounting and grounding systems require a high part count and, as a result, have higher costs. Others are not compatible with grooved PV modules or PV modules comprising a substantially flat outward facing surface on the frame. And still, others do not provide a reliable electrical ground bond between the support base and PV modules.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, apparatus, tools, and methods which are meant to be exemplary and illustrative, not limiting in scope. In various embodiments, one or more of the above-described problems have been reduced or eliminated, while other embodiments are directed to other advantages or improvements.

One embodiment of the invention comprises an apparatus for mounting a photovoltaic (PV) module on a surface, comprising a support with an upper surface, lower surface, tabs, and openings, and a clip with an arm and a notch, where the apparatus resists wind forces and seismic forces and creates a grounding electrical bond between the PV module, support, and clip. One embodiment of the invention further comprises a method for installing PV modules on a surface that includes arranging supports in rows along an X axis and in columns along a Y axis on a surface such that in each row such that in each row the distance between two neighboring supports does not exceed the length of the longest side of a PV module and in each column the distance between two neighboring supports does not exceed the length of the shortest side of a PV module, placing a PV module upon the supports such that each corner of the frame of the PV module rests on a support, and connecting the supports to the PV module by engaging a clip to at least a portion of the frame of the PV module and to the support. One embodiment of the invention further comprises an apparatus for mounting a PV module on a surface, comprising a support with an upper surface, lower surface, tabs, and openings, a clip with an arm and a notch, and a bracket. One embodiment of the invention additionally comprises a method for installing a PV module on a surface that includes arranging supports in rows along a X axis and in columns along a Y axis on a surface such that in each row the distance between two neighboring supports does not exceed the length of the longest side of a PV module and in each column the distance between two neighboring supports does not exceed the length of the shortest side of a PV module, placing a PV module upon the supports such that each corner of the frame of the PV module rests on a support, connecting the supports to the PV module by engaging a clip to at least a portion of the frame of the PV module and to the support, and securing a bracket to a support and to the surface or structure.

In addition to the exemplary aspects and embodiments described above, further aspects and embodiments will become apparent by reference to the figures and by study of the following detailed descriptions.

BRIEF DESCRIPTION OF THE DRAWINGS

Demonstrative embodiments are illustrated in referenced figures and drawings. It is intended that the embodiments and figures disclosed herein are to be considered illustrative rather than restrictive.

DETAILED DESCRIPTION OF ONE OR MORE EMBODIMENTS OF THE INVENTION

Terms

Figure 1:
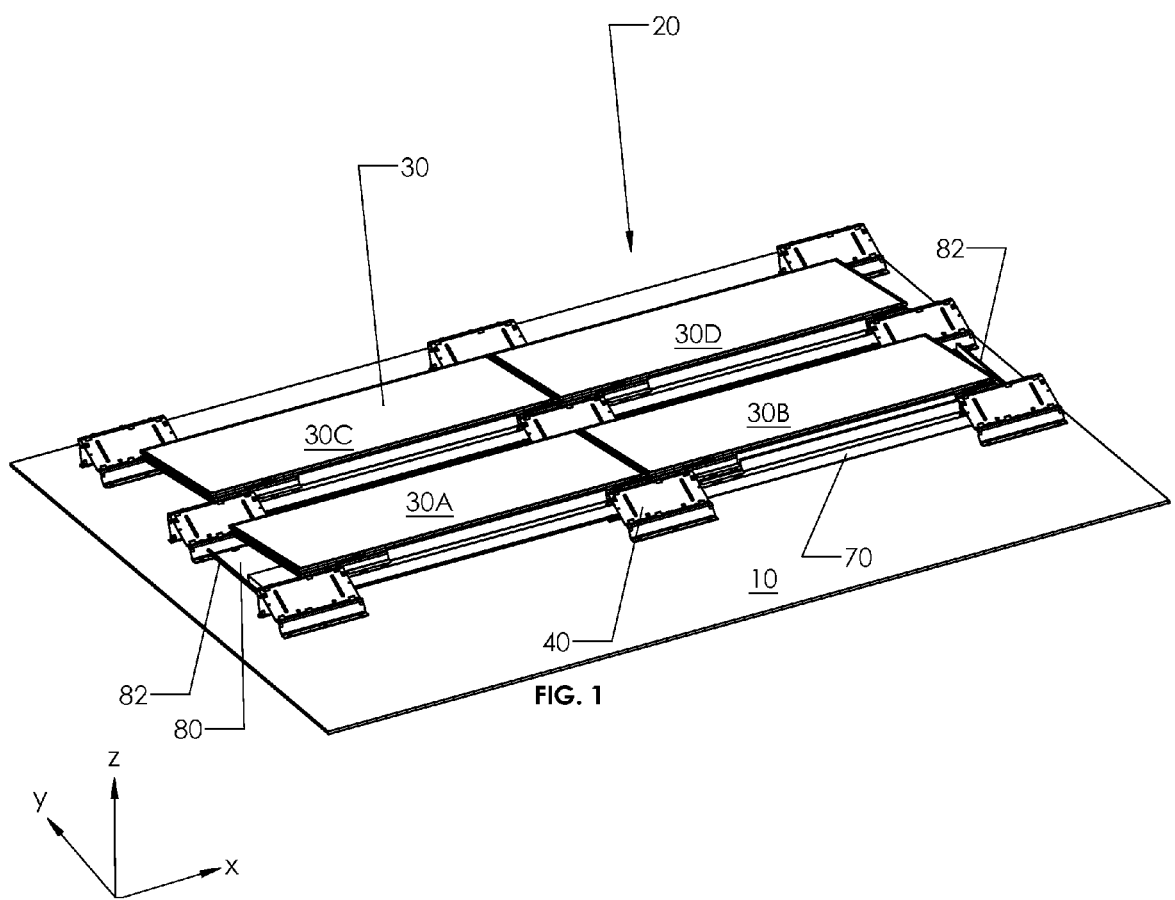
FIG. 1 is an isometric view of a PV array on a flat or low-slope surface.

With reference to the figures and description herein but without limitation:

Adjacent refers to being positioned next to or adjoining or neighboring, or having a common vertex or common side. Thus, adjacent PV panels would include PV panels that have one side close to (from a few inches apart to abutting) and facing one side of another PV panel. Sometimes, but not always, the corners of adjacent panels align; so four adjacent panels would have one corner each that nearly or actually touch the other three corners.

Adjustable refers to the capability of being changed so as to match or fit.

Adjustably connected refers to an object, item, mechanism, apparatus, combination, feature, link or the like that loosely, slidable, or rigidly links, interlocks, joins, unites or fastens two or more things together in a manner that can be changed so as to match or fit.

Attach or attachment refers to one or more items, mechanisms, objects, things, structures or the like which are joined, fastened, secured, affixed or connected to another item, or the like in a permanent, removable, secured or non-permanent manner.

Axis of rotation refers to a center around which something rotates, sometimes considered a straight line through all fixed points of a rotating rigid body around which all other points of the body move in a circular manner.

Beneath refers to extending or being situated directly or substantially underneath, typically with close proximity or contact.

Between refers to being situated, located, or otherwise oriented at, in, or across the space separating two objects or regions.

Connect or connecting refers to loosely, slidably, or rigidly bringing together or into contact with or joining or fastening to form a link or association between two or more items, mechanisms, objects, things, structures or the like.

Connector refers to an object, item, mechanism, apparatus, combination, feature, link or the like that loosely, slidable, or rigidly links, interlocks, joins, unites or fastens two or more things together. May also include a device, an object, item, mechanism, apparatus, combination, feature, link or the like for keeping two parts of an electric or electronic circuit in contact.

Coplanar refers to the circumstance where two or more objects are situated, located, or otherwise substantially oriented in the same plane.

Couple refers to loosely, slidably, or rigidly joining, linking, interlocking, connecting or mating two or more objects or items, mechanisms, objects, things, structures or the like together.

Coupling refers to an object, item, mechanism, apparatus, combination, feature, link or the like that loosely, slidably, or rigidly joins, links, mates, interlocks, or connects two things together.

Double male connector refers to a connector (see above) having two male or insertable members, usually used for connecting two female or receiving parts or coupling members together.

Disengage refers to detaching, freeing, loosening, extricating, separating or releasing from something that holds-fast, connects, couples or entangles. See Engagement below.

Enable refers to facilitating or making possible, able, feasible, practical, operational, or easy; or to cause to operate.

End refers to a final part, termination, extent or extremity of an object, item, mechanism, apparatus, combination, feature, or the like that has a length.

Engage refers to interlocking or meshing or more items, mechanisms, objects, things, structures or the like. See Disengage above.

Frame refers to an essentially rigid structure that surrounds or encloses a periphery of an item, object, mechanism, apparatus, combination, feature, or the like.

Freely refers to being without or exempt from substantial restriction or interference by a given condition or circumstance. May also refer to being unobstructed, unconstrained, unrestricted or not being subject to external restraint.

Gap refers to a break, void, opening, cleft, breach, aperture, separation, or space, as well as an interruption of continuity, between two objects, or within an object.

Groove refers to a long, narrow cut, rut, indentation, channel, furrow, gutter, slot or depression often used to guide motion or receive a corresponding ridge or tongue.

Height adjustable refers to change or adapt to bring items, objects, mechanisms, apparatus, combinations, features, components or the like into a proper, desired or preferred relationship of a distance or elevation above a recognized level, such as the ground or a support surface.

Insertable refers to an object, item, mechanism, apparatus, combination, feature, link or the like which is capable of being put in, entered into, set within, introduced, inset, inserted, placed, fit or thrust into another an object, item, mechanism, apparatus, combination, feature, link or the like.

Integral with refers to being essential or necessary for completeness, constituent, completing, containing, entire, or forming a unit. May also refer to consisting or composed of parts that together constitute a whole.

Laminate or PV laminate refers to a photovoltaic device having an interconnected assembly of solar cells, also known as photovoltaic cells which is frequently, but not always, laminated with glass and/or other materials.

Length refers to a measurement or extent of an object, item, mechanism, apparatus, combination, feature, link or the like from end to end, usually along the greater or longer of the two or three dimensions of the body; in distinction from breadth or width.

Located refers to where an object or a series of objects is physically situated with respect to one or more other objects.

Locked refers to fastened, secured or interlocked.

Orthogonally refers to relating to or composed of right angles, perpendicular or having perpendicular slopes or tangents at a point of intersection.

Near refers to a short distance from an object or location.

Perimeter refers to an essentially continuous line forming the boundary, periphery or circuit of a closed geometric figure; the outer limits of an area.

Photovoltaic module (sometimes referred to as a PV module, solar panel, solar module, or photovoltaic panel) refers to a packaged, interconnected assembly of solar cells, also known as photovoltaic cells, frequently, but not always, laminated with glass and other materials and sometimes surrounded by a frame. A plurality of PV modules are commonly used to form a larger photovoltaic system referred to as a PV array (see below), to provide electricity for commercial, industrial and residential applications.

Pivotally refers to or relates to an object, item, mechanism, apparatus, combination, feature, link or the like serving as a pivot or the central point, pin, shaft or contact on which another object, item, mechanism, apparatus, combination, feature, link or the like turns, swings, rotates or oscillates.

Positionable refers to an object, item, mechanism, apparatus, combination, feature, link or the like which is capable of being positioned, placed or arranged in a particular place or way.

Preload refers to the force that must be overcome to separate a joint once force is applied to attach a coupling to the joint. The applied force deforms the coupling and/or one or more of the components of the joint and becomes the force that must be overcome to separate the joint.

PV laminate refers to a photovoltaic device having an interconnected assembly of solar cells, also known as photovoltaic cells which is frequently, but not always, laminated with glass and/or other materials. A PV laminate with an integral frame which may support the PV laminate is sometimes referred to as a PV module.

PV module refers to a photovoltaic module (sometimes referred to as a solar panel or photovoltaic panel) is a packaged interconnected assembly of solar cells, also known as photovoltaic cells, frequently, but not always, laminated with glass and other materials and sometimes surrounded by a frame. A plurality of PV modules are commonly used to form a larger photovoltaic system referred to as a PV array (see below), to provide electricity for commercial, industrial and residential applications.

PV array refers to a plurality of photovoltaic modules connected together often in a pattern of rows and columns with module sides placed close to or touching other modules.

Rail refers to a relatively straight, usually essentially evenly shaped along its length, rod, beam, girder, profile or structural member or the like, or plurality of such, of essentially rigid material used as a fastener, support, barrier, or structural or mechanical member.

Rail member refers to a structural entity, element or unit (or part of such entity, element, or unit) that acts as or embodies a rail.

Removable refers to one or more items, mechanisms, objects, things, structures or the like which are capable of being removed, detached, dismounted from or taken-away from another item or the like, or combination.

Rectilinear refers to one or more items, mechanisms, objects, things, structures or the like which are essentially bounded by, characterized by or forming straight and substantially parallel lines.

Rigidly couples refers to joining, linking, connecting or mating two or more objects or items, mechanisms, objects, things, components, structures or the like together in a non-flexible manner that is difficult to bend or be forced out of shape.

Roof refers to a structure or protective covering that covers or forms the upper covering or top of a building. The upper surface of a roof is often used as a support surface for mounting, connecting or otherwise attaching a PV module or a PV array.

Rotatably refers to one or more items, mechanisms, objects, things, structures or the like which are capable of being rotated, revolved or turned around or about an axis or center.

Skirt refers to an edging, molding or covering that may be fixed to the edge of a PV module to conceal or block the bottom area under a PV array when the PV array is mounted to a support surface.

Span refers to an extent or measure of space between, or the distance between two points or extremities.

Support or supporting refers to one or more items, mechanisms, objects, things, structures or the like which are capable of bearing weight or other force, often to keep the item or the like from falling, sinking, slipping or otherwise moving out of a position.

Support structure refers to a structure, such as a roof, table or the ground which may provide a base for securing PV modules to form a PV array.

Threaded refers to one or more items, mechanisms, objects, things, structures or the like which have, embody or include an essentially helical or spiral ridge or rib, as on a screw, nut, or bolt.

Various locations refers to places, positions or sites that are different from one another, more than one, individual or separate.

Vertical height adjustment refers to change or adapt to bring items, mechanisms, objects, things, components, structures or the like or components into a proper, desired or preferred relationship of a distance or elevation above a recognized level, such as the ground or a support surface.

Width refers to the state, quality, or fact of being wide or a measurement or extent of something from side to side; in distinction from breadth or length.

FIGS. 1-11 show an embodiment of a photovoltaic (PV) system 20 for mounting PV arrays on substantially flat or low-sloped roofs or surfaces 10. PV system 20 may comprise PV modules 30 and various connecting and supporting equipment as will be described in more detail below. PV modules will be referred to generically in the present disclosure as PV modules 30 and more specifically as PV modules 30a, 30b, 30c, 30d when discussing PV modules 30 in relation to each other, such as a discussion relating to the relative position of PV modules 30 in a PV system 20. Some embodiments may further comprise wind deflecting and/or ballasting equipment as will also be described below. Some embodiments described in the instant disclosure may also be disclosed, described and shown in U.S. Provisional Patent Application 61/656,240 entitled: "Rail Mounted PV Apparatus, Method and System", filed Jun. 6, 2012; 61/698,292 entitled "Module Attachment System and Module Support System", filed Sep. 7, 2012; and 61/736,544 entitled "Ancillary Apparatus, System and Method for Photovoltaic Modules", filed Aug. 7, 2012; each of which is incorporated by reference herein in its entirety. Throughout this document, like numbers will reference like parts, features, items or structures, even if they may be combined with or part of one or more different embodiment(s).

FIG. 1 shows a perspective view of an embodiment of a flat or low-sloped support structure, such as a roof or surface, the ground, a space, water, or land vehicle, or any structure or terrain with relatively mild slopes and/or contours, such as roof 10, with a system of components for mounting a PV array on top of roof 10, such as PV system 20. An x, y, z coordinate system as shown shall be referenced in this disclosure to refer to example directions and locations within PV system 20, though one skilled in the art will recognize that the axis or direction of an object within system 20 may change while still being within the spirit and scope of the instant disclosure.

Figure 2:
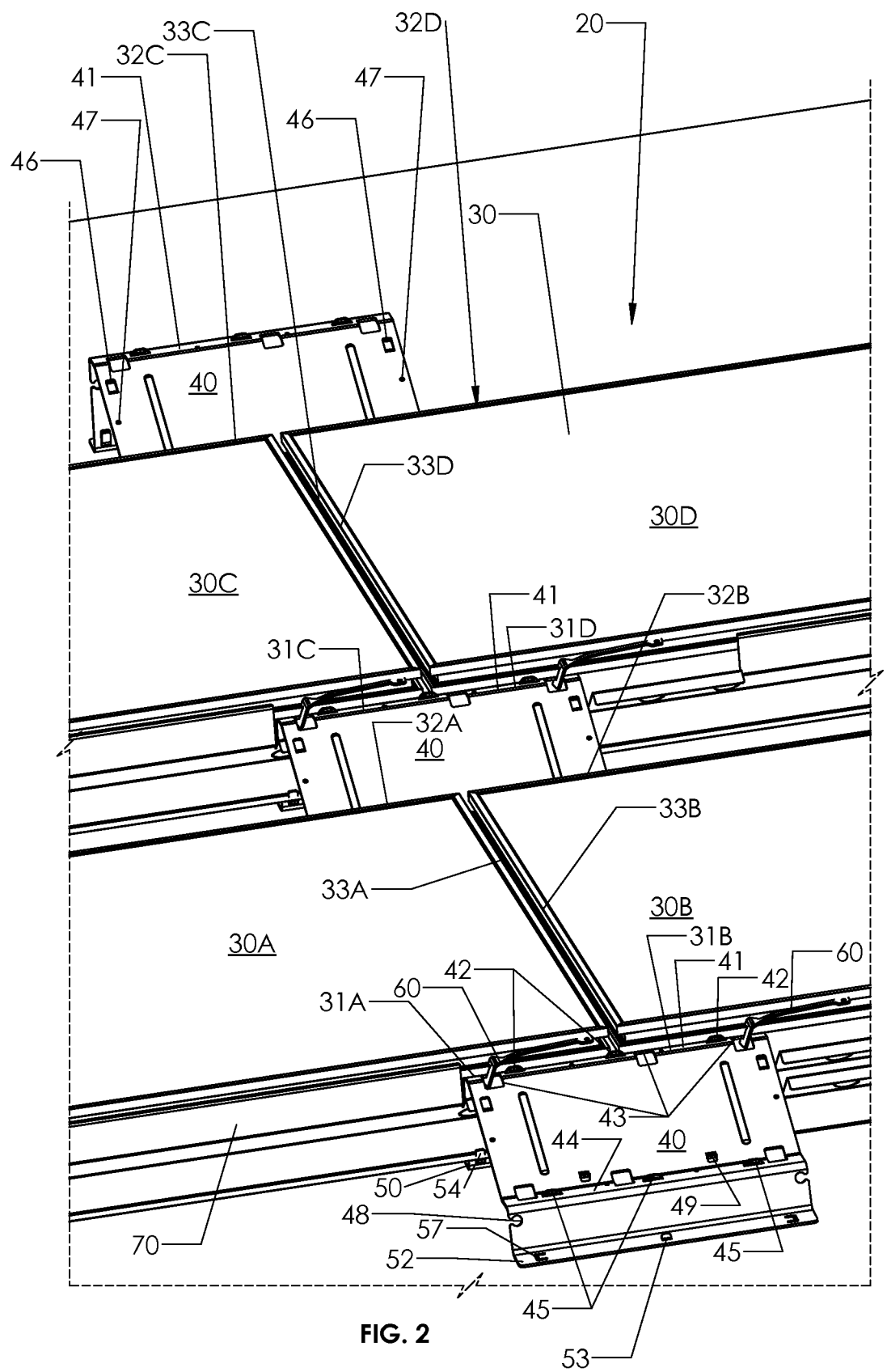
FIG. 2 is a close up of a portion of FIG. 1.

FIG. 2 shows a close-up view of the perspective view of FIG. 1, focused roughly on the middle area of PV system 20. PV system 20 may comprise a support structure, pan, corner support, or device for supporting some of the sides, edges, or corners of PV modules 30a, 30b, 30c, 30d, such as support 40. Though other purposes and objects will be disclosed herein, supports 40 may be placed on roof 10 for at least one purpose being the linking and supporting of PV modules 30 at a predetermined angle (around or about the x-axis) and preventing, limiting or inhibiting PV modules 30 from being moved, shifted or blown off roof 10 by the wind, seismic forces, or other similar exerted forces. The instant disclosure shows PV modules 30 being held by supports 40 at a tilt angle of approximately 5 degrees around the x-axis, however other angles, such as between 2-10, 5-15, 10-25 or 20-40 degrees are explicitly contemplated and hereby disclosed. In some embodiments supports 40 may also establish an electrical ground bond between adjacent PV modules 30, hold or retain wind deflectors 70, hold or retain ballast blocks or ballast trays 80 (FIG. 1), and/or provide means, apparatus, systems or structures for managing, mounting, positioning, and/or connecting wires, conduit, wiring equipment, other ancillary equipment, and the like.

With additional reference to FIGS. 9-11, and as will be described in more detail below, support 40 is shown comprising an upper pedestal or support portion, such as upper pedestal 41, for supporting an edge or corner of PV module 30a, 30b, 30c, 30d that may typically, though not necessarily, reside at a higher location along the z-axis than another lower edge or corner; and a lower pedestal or support portion, such as lower pedestal 44, for supporting an edge or corner of PV module 30a, 30b, 30c, 30d that may typically, though not necessarily, reside at a lower location along the z-axis than another higher edge or corner. As shown in FIG. 2, upper pedestals 41 support upper edges 31a, 31b, 31c, 31d of PV modules 30a, 30b, 30c, 30d, respectively, and lower pedestals 44 (not all visible in this view) support lower edges 32a, 32b, 32c, 32d of PV modules 30a, 30b, 30c, 30d, respectively. As shown, supports 40 may support PV module 30 along edges near the corners, though in other embodiments supports 40 may support edges not near, or even far from, the corners. In still other embodiments supports 40 may support the side edges 33a, 33b, 33c, 33d.

Support 40 may further comprise various other features such as upper positioning tabs 42 and lower positioning tabs 45, for aiding in the positioning of PV module 30, such as when it is being placed onto support 40; openings 43 for receiving lever clips 60 (see below); deflector tabs 46, 54, for holding a portion of a wind deflector 70 (see further description below); holes 47 for receiving wire ties or the like; wire cutouts 48, for receiving wires or wire management devices, such as wire clips, bushings, connectors, restraints, etc. or the like; drop-in positioning tabs 49 for guiding modules 30 from a vertical position down into the final mounted position as shown; slip sheet slots 57 for retaining an edge of a slip sheet; and ballast pan tabs 53 and 51 (not shown). Supports 40 may be placed directly on roof 10 as shown. High-side horizontal flange 50 and low-side horizontal flange 52 may provide surfaces approximately parallel with roof 10 for easy placement thereon. A surface area of flanges 50 and 52 may be large enough to sufficiently distribute a load of system 20 over roof 10. In some embodiments the surface area of flanges 50 and 52 may be lower than shown here and in others it may be higher, depending on the amount of point load distribution that may be required. In other embodiments supports 40 comprise rubber pads and/or slip sheets underneath flanges 50 and 52, for example, to prevent damage to a surface of roof 10.

Support 40 may be manufactured by cutting and/or stamping sheet metal, molding plastic, casting metal, or via other suitable manufacturing methods. As shown in FIG. 9, support 40 may comprise a profile that is approximately N-shaped or generally an upside-down U-shape with an upper vertical portion 55 and a lower vertical portion 56 that cant slightly inward, thereby enabling supports 40 to be easily stackable for shipping. Other embodiments that contemplate other profiles for supports, such as U-shaped, H-shaped, etc. and the like, are still in the spirit and scope of the present disclosure and are explicitly contemplated and disclosed herein, so long as such supports provide pedestals for PV modules 30 and can connect PV modules 30 to supports, such as via lever clips 60, as will be discussed below.

Figure 3:
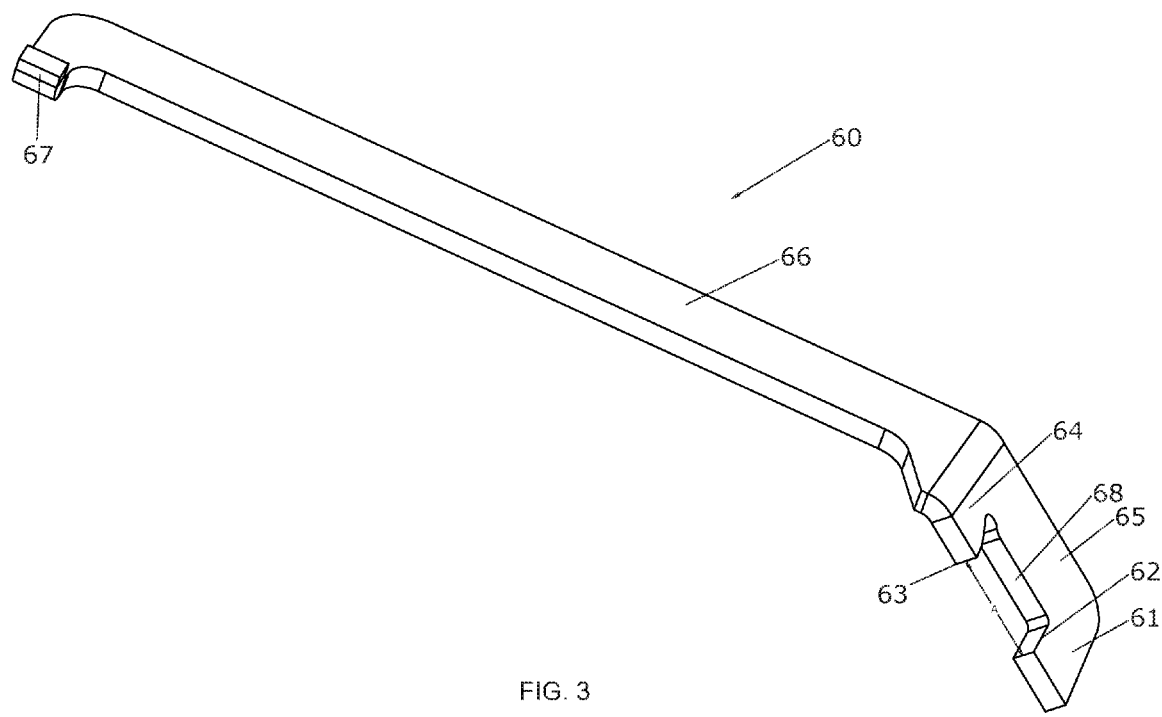
FIG. 3 is an isometric view of a clip.

FIG. 3 shows a perspective view of a bracket, spring clip, "dream clip", "C-Lock", lock, spring arm device, spring bracket, pivot-lock clip, lever clamp, or lever clip, such as lever clip 60, which is similar to other clips and clamps disclosed and shown in U.S. Provisional Patent Application 61/656,240 entitled "Rail Mounted PV Apparatus, Method and System" filed approximately Jun. 6, 2012; 61/698,292 entitled "Module Attachment System and Module Support System" filed approximately Sep. 7, 2012; and 61/737,066 entitled "Connecting Components for Photovoltaic Arrays" filed approximately Dec. 13, 2012; each of which is incorporated by reference herein in its entirety. Lever clip 60 may comprise a head 65, a lever or spring arm 66, and a catch or tab 67. Head 65 may comprise a slot, channel, opening, or notch 68 bounded by an upper bump, tab, shelf, protrusion, flange, male portion, or upper lip 64 and a lower bump, tab, shelf, protrusion, flange, male portion, or lower lip 61. Lip 64 may comprise an edge 63 and lip 61 may comprise an edge 62 as will be discussed below.

Figure 4:
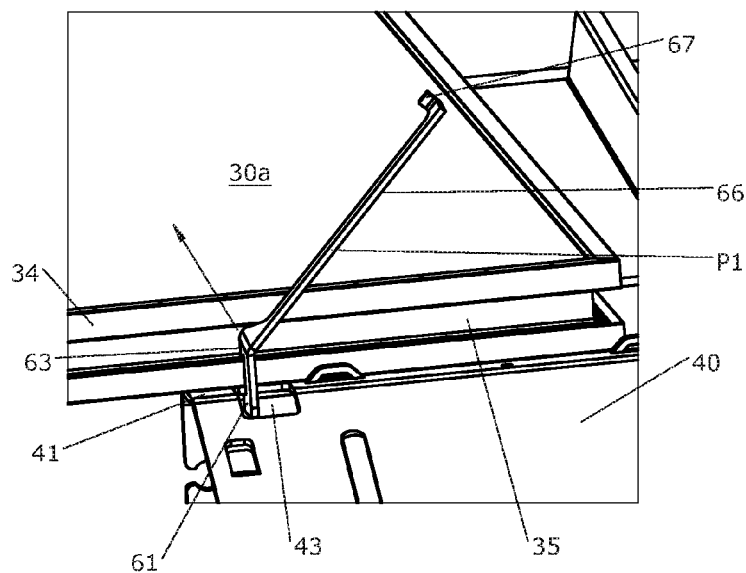
FIGS. 4-6 are progressive views of a clip engaging a frame and a support.
Figure 5:
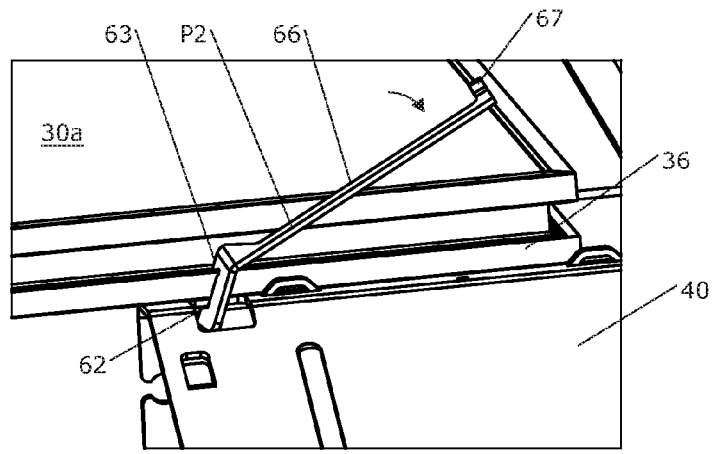
Figure 6:
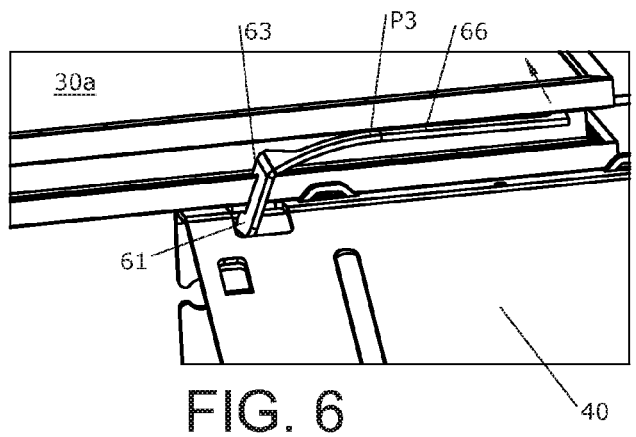
Figure 7:
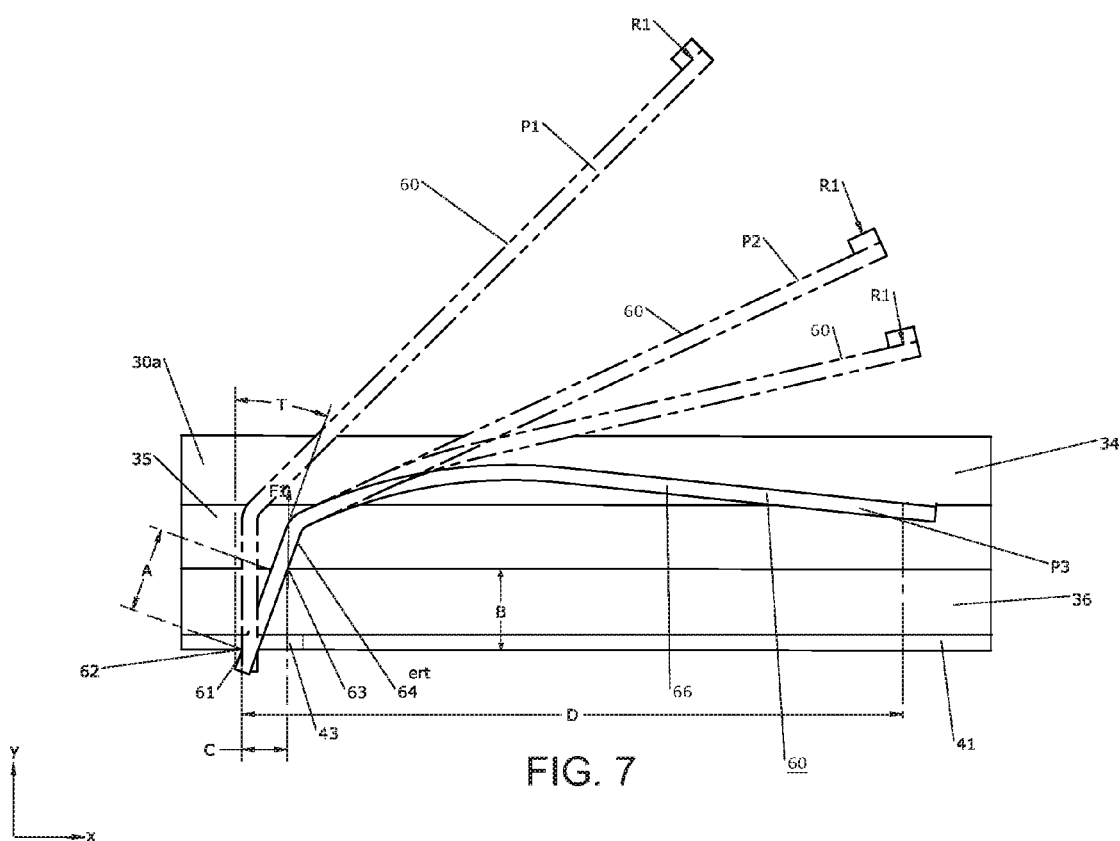
FIG. 7 is an orthogonal view of the stages of position of a clip as it engages a frame and a support.

FIGS. 4-6 show perspective views and FIG. 7 shows an end view (looking straight at the side of PV module 30a) of a lever clip 60 being utilized to connect PV module 30a to support 40. Connection of modules 30 to other locations on upper and lower pedestals 41 and 44 is similar except for the location of components relative to each other. Lever clip 60 may be installed and/or operate as follows. First, lever clip 60 may be oriented approximately as shown in FIG. 4 and FIG. 7 as position P1, then lever clip 60 may be moved toward PV module 30a approximately in the direction of the arrow in FIG. 4, inserting a portion of upper lip 64 into groove 35 in frame 34 of PV module 30a while lower lip 61 is positioned underneath upper pedestal 41, as by inserting partially through opening 43. The distance A (see FIGS. 3 and 7) is shown as the minimum distance between edges 62 and 63 and effectively defines the height of notch 68. Distance A may be greater than distance B as shown in FIG. 7, which is the distance from the opening of groove 35 to the bottom of upper pedestal 41, such that notch 68 may fit around both lower lip 36 of frame 34 and the full thickness of upper pedestal 41.

Once lever clip 60 is located in position P1, lever clip 60 may be rotated in the direction of the arrow in FIG. 5, referred to herein as the engaging direction (and generally clockwise around the y-axis in this example), until edges 62 and 63 make contact with frame 34 and the underside of upper pedestal 41, respectively, effectively positioning lever clip 60 in position P2. In position P2 edges 62 and 63 are just making contact. Installation continues with additional pressure being applied by the installer in the engaging direction, as shown by the arrow at P2 in FIG. 7. Since edges 62 and 63 are now engaging with frame 34 and upper pedestal 41, the additional pressure may begin bending of spring arm 66 as rotation continues; edges 62 and 63 may also cut into frame 34 and pedestal 41 due to sharp edges, thereby creating a solid electrical ground bond connection between frame 34 and support 40 and/or enabling clip 60 to resist lateral sliding relative to frame 34.

Once tab 67 is low enough, it may be pushed or otherwise encouraged in the direction towards frame 34 until tab 67 is located at least partially inside groove 35 or at least partially under frame 34, then lever clip 60 may be released. The action of releasing lever clip 60 may result in spring arm 66 exerting a spring force in a disengaging direction, which is approximately opposite the engaging direction, or opposite arrows R1 in FIG. 7 (counterclockwise as shown, though oppositely shaped parts in other embodiments, see below, may work the same except the rotational directions may be reversed). The release of lever clip 60 may now result in tab 67 moving upward slightly until it catches inside groove 35, reaching a stable position, position P3 as shown in FIG. 6 and FIG. 7.

Lever clip 60 provides a novel mechanism for connecting PV modules to support structures. The basic theory of operation is better understood by further reviewing FIG. 7. With lever clip 60 fully installed in position P3, downward forces on PV module 30*a* may be primarily resisted by upper pedestal 41 of support 40. Upward forces, such as wind uplift, may result in a force F1 being applied to edge 63 in the direction shown in FIG. 7. Since a principal portion resisting uplift force may be edge 62, edge 62 under such load may effectively act as a pivot point and thus the disengaging direction of lever clip 60 may effectively be a counterclockwise rotation about edge 62. However, it may be relatively easy for lever clip 60 to resist movement in the disengaging direction since (a) only a small component of force F1 is in the rotational disengaging direction since angle T is relatively small and thus the effective moment arm C for force F1 acting about pivot 62 is relatively small, (b) spring arm 66 acts as a lever to resist rotation in the disengaging direction with a substantial mechanical advantage, which may be calculated as distance D minus distance C, then divided by distance C, and (c) rotation in the disengaging direction, since the angle T is relatively small, may require module 30*a* to move laterally, yet module 30*a*, as shown, may also be held by at least 3 other lever clips 60, and such clips 60 may not all face the same direction (or operate in the same rotational direction, see below), thereby further reducing the load required to resist rotation in the disengaging direction. The lateral stability of a system of clips 60 may result, for example, from some clips 60 having a disengaging direction of clockwise and others having a disengaging direction of counterclockwise. Thus, lateral movements of PV module 30*a* in both the positive and negative directions along the x-axis may result in some clips 60 opposing that movement since such movement may tend to further engage such clips 60.

Different embodiments contemplate different values for the angle T, with typical values being in the range of 5 to 40 degrees; other typical values may include 1-44, 5-15, 15-20, and 30-45 degrees. The mechanical advantage for spring arm 66 may be calculated as the ratio of the distance D divided by the distance C as shown in FIG. 7. With contemplated typical lengths for spring arm 66 of 3-10 inches and lengths for the distance C in the range of 0.1 to 0.5 inches, typical mechanical advantage ratios may be in the range of 6:1 up to 100:1. Other lengths and ratios are also explicitly contemplated.

In addition to providing substantial means, apparatus, systems or structures for resisting rotation in the disengaging direction that may be caused by force F1, and therefore maintaining a relatively secure connection between PV module 30*a* and support 40, including under an uplift load, lever clip 60 may provide other advantages as well. For example, since tab 67 on spring arm 66 may not be presented with large loads during an uplift condition, as discussed above, spring arm 66 may comprise a relatively low spring rate that enables easy bending of spring arm 66 when moving from position P2 to position P3, thus making it relatively easy to install lever clip 60 in the field. This may be in contrast to prior art systems where springs may be used in a manner that forces the spring to resist loads directly, thereby requiring either a stiff spring that is harder to install or a weaker spring that provides poor performance under load. When in position 3, spring arm 66 may also place a significant pre-load on the connection joint between PV module 30*a* and support 40. This pre-load may be effectively amplified by the mechanical advantage discussed above and may prevent movement within a joint as long as F1 is lower than a relatively high value. Thus, in practice the pre-load that spring arm 66 applies to a connection joint between PV module 30*a* and support 40 may substantially stabilize the connection and reduce wear over time due to cyclic loading (where such cyclic loads act on the joint with less force than the effective pre-load on the joint).

Lever clip 60 is shown in FIGS. 1-11 as requiring a generally clockwise rotation to connect PV modules 30 to supports 40. In other embodiments similar to PV system 20 lever clip 60 is partially or completely replaced by a lever clip that is the same as lever clip 60 except that it is a mirror image and thus operates in the opposite direction (counterclockwise to engage instead of clockwise).

A typical installation sequence for the core components of PV system 20 (supports 40, PV modules 30, and lever clips 60) may proceed as follows. First, supports 40 may be placed onto roof 10 in the approximate locations shown in FIG. 1. Next PV modules are placed onto top of supports 40 in the positions shown. While there are numerous ways to place modules 30 into supports 40, in one embodiment, supports 40 may comprise upper and lower positioning tabs 42 and 45 to provide a hard stop that a module 30 may be slid up against to determine the correct position for the mating parts relative to each other. PV modules 30 may be installed by placing module 30 essentially vertically onto the slope just above drop-in positioning tabs 49. Gravity may then assist as module 30 slides down slope and contacts tabs 49. Modules 30 may now be rotated from an essentially vertical position down into a final mounted position as shown. Once each module has been properly located on top of the 4 supports 40 that support it, then lever clips 60 may be installed according to the method described above. Each module 30 may be held by four lever clips 60, in one embodiment as shown, with one lever clips 60 near each corner. Lever clips 60 are shown installed at least partly in the upper pedestals 41 in FIG. 9, but not installed in the lower pedestals 44 so that module 30*a* can be shown abutting positioning tab 45 (see FIG. 13 for an example of how lever clip 60 may connect a module 30 to lower pedestal 44).

The instant disclosure illustrates optional accessories such as wind deflectors 70 and ballast pans 80 (as will be discussed in more detail below) as well as other auxiliary or ancillary devices (some of which are disclosed or described herein, or in the documents incorporated by reference herein) which may be combined or attached to PV modules or mounting systems and apparatus. Such accessories are not necessarily required, but in some cases there may be benefits to including such devices. For example, wind uplift forces on PV system 20 may be reduced in certain cases if wind deflectors 70 are included on some or all PV modules 30. In other cases the provision of ballast pans 80 may enable the addition of ballast blocks 81 to PV system 20, which may reduce, minimize or eliminate the need for penetrating roof 10 with screws to secure PV system 20 to roof 10. While the embodiments shown in FIGS. 1-11 shows optional wind deflector 70 and ballast pan 80, other embodiments may include structures or systems essentially identical to the embodiments in FIGS. 1-11 except that they do not include wind deflector 70 or ballast pan 80. Further embodiments are essentially identical to the embodiment in FIGS. 1-11 except they do not include wind deflector 70 yet they may include ballast pan 80. Other embodiments are essentially identical to the embodiments in FIGS. 1-11 except they do not include ballast pan 80 yet they do include wind deflector 70.

Figure 8:
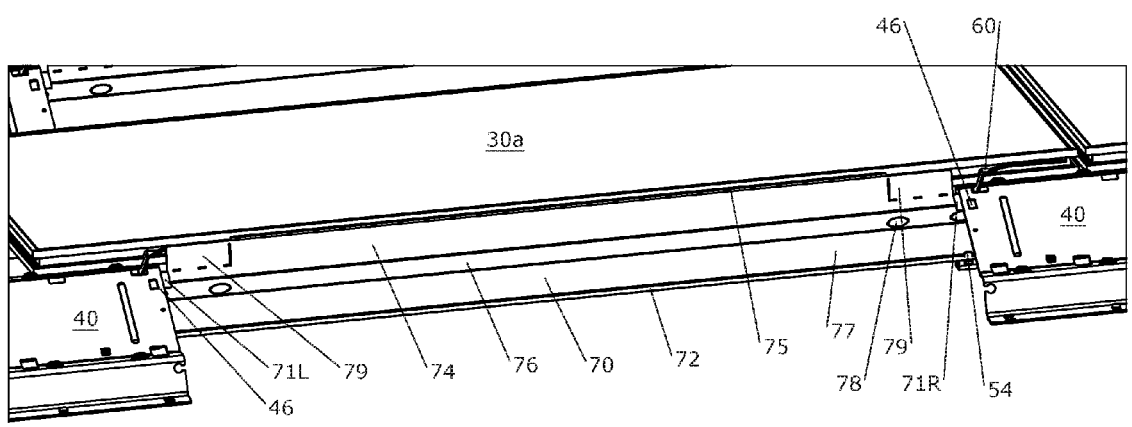
FIG. 8 is an isometric view of a portion of a PV array with a wind deflector installed.
Figure 9:
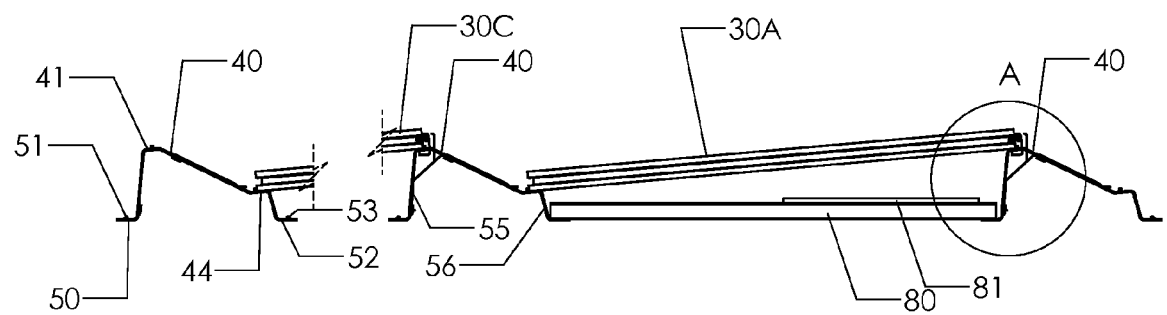
FIG. 9 is an orthogonal view of a PV array on a flat or low-slope surface.
Figure 10:
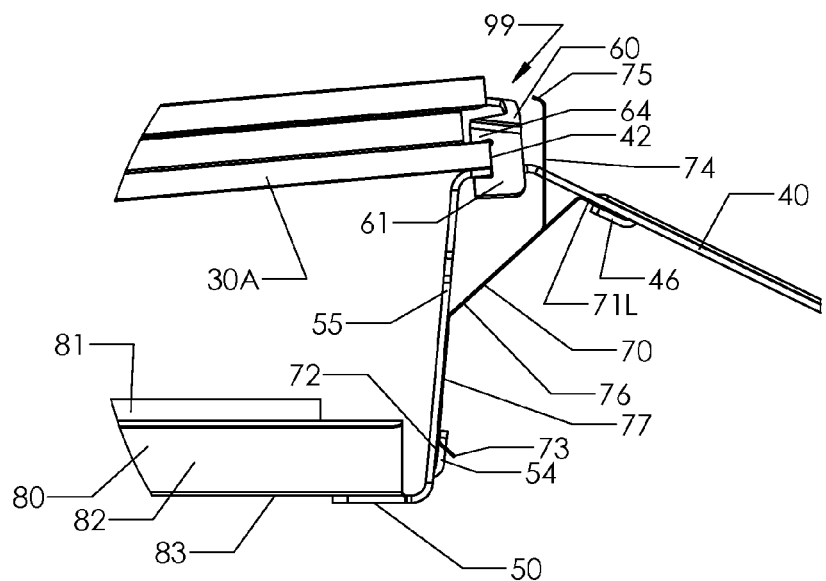
FIG. 10 is an enlargement of a portion of FIG. 9.

FIGS. 8-11 provide more details regarding wind deflector 70 and ballast pan 80. FIG. 8 shows a close-up view of the perspective view in FIG. 1 that focuses on optional wind deflector 70 located behind module 30*a*. FIG. 9 shows a side view of PV system 20 and FIG. 10 shows a close-up of region A in FIG. 9.

It is hereby contemplated and disclosed that wind deflector 70 may be made, produced or constructed out of relatively thin sheet or cast metal, plastic, ceramic, composite, or the like. Wind deflector 70 may comprise two flaps 71L, 71R located at opposite ends of deflector 70 for the purpose of inserting behind deflector tabs 46, such as in order to hold deflector 70 in place. Deflector 70 may also comprise a lower edge or flap 73 for inserting behind deflector tabs 54, such as in order to further retain deflector 70. Flap 73 may be bent at a slightly outward-facing angle relative to lower vertical portion 77 so that insertion of flap 73 behind flaps 54 then rotating upward to insert flaps 71L, 71R behind deflector tabs 46 results in partial bending of flap 73 and a pre-loaded tight fit behind tab 54. It is noteworthy in this embodiment that flap 73 is located essentially fully behind tab 54 as shown in FIG. 8 and at 72 in FIG. 10, but since tabs 54 are short, flap 73 is only deformed right at tab 54 and thus appears in FIG. 10 to the right of tab 54 since that is where it exists in the region behind tab 54.

A typical installation sequence for wind deflector 70 may proceed as follows. First, the core components of PV system 20 (supports 40, PV modules 30, and lever clips 60) may be installed on roof 10, as previously described or in another manner. Next deflector 70 may be positioned close to its final position as shown in FIG. 8, except rotated away from module 30*a* slightly such that flap 73 is slightly higher than tabs 54 and approximately parallel with upper vertical portion 55. Deflector 70 is inserted behind tabs 54, then pushed all the way down, then rotated back toward module 30*a* until such flaps 71L and 71R are past tabs 46. Deflector 70 may now be rotated back away from module 30*a* slightly as flaps 71L and 71R are tucked behind tabs 46.

Wind deflector 70 may further comprise pre-stressed conduit knockouts 78 for connecting to conduit fittings and perforated portions 79, and may be used for bending down even with flaps 71L, 71R at the end of a row when it is desired to slide support 40 fully up under PV module 30.

Prior art wind deflectors typically comprise a wind deflector for the purposes of (a) preventing air from impinging on the under-side of a PV module and producing lift, and (b) reducing drag when wind strikes the deflector straight-on (from the rear or high side) which might cause a PV array to slide along a roof. Thus, wind deflectors in such systems typically block the high side to prevent wind from striking the backside of the PV module and angle the deflector to reduce drag; therefore such prior deflectors may have only attempted to serve their purpose when the wind is directed toward the high side of the module. Some prior systems have attempted to reduce lift by also including vent holes intended to ensure equal pressure on the topside and underside of the PV module. However, such attempts have not taught vent locations that connect specific lower pressure regions on the topside of a PV module with the underside of the PV module.

Figure 11:
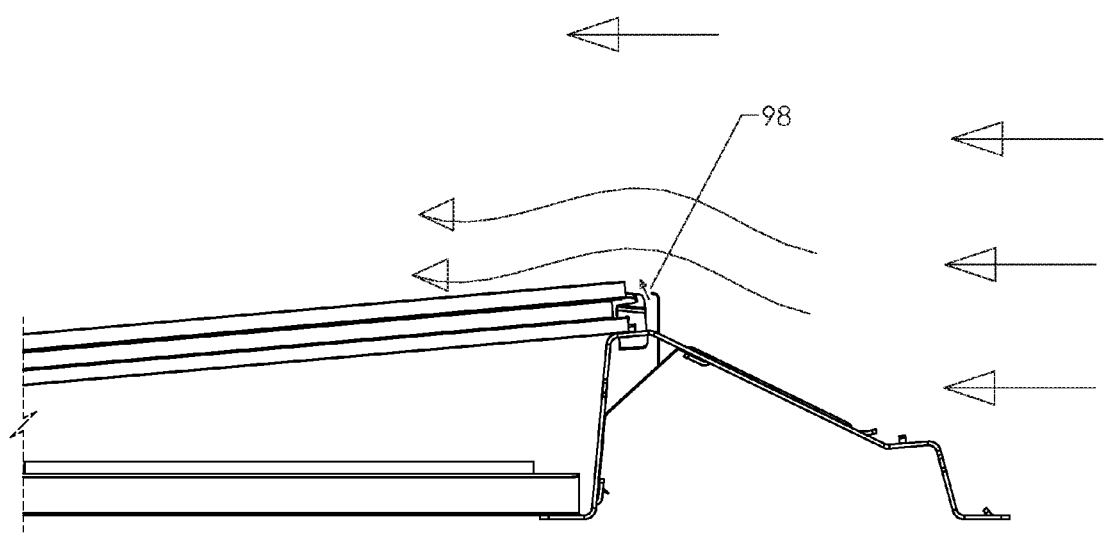
FIG. 11 is an orthogonal view of a portion of a PV array on a flat or low-slope surface.

Referring more specifically to FIGS. 10-11, wind deflector may comprise a special shape optimized to reduce uplift forces on PV modules 30 due to wind. Wind deflector 70 may comprise a lower vertical portion 77, an outward angled portion 76 that allows deflector 70 to go all the way up near a top surface of PV module 30, and an upper vertical portion 74 that ends in a small top flange 75 that may angle back over toward PV module 30*a*, for example to enhance air flow characteristics. Upper vertical portion 74 is positioned, for example to leave a gap 99 between wind deflector 70 and PV module 30*a*.

At the wind speeds encountered by a PV array, the fluid (air) may be viewed as essentially incompressible. Therefore, Bernoulli's Principle may apply: an increase in the speed of the fluid may be accompanied by a decrease in pressure. PV module 30 and deflector 70 effectively reduce the cross section of the air stream (when the air stream is flowing as shown in FIG. 11). In order to maintain the same flow rate with this reduced cross section, the velocity of the air stream increases. And this velocity reaches a maximum near apex 98 where module 30 and deflector 70 meet. Deflector 70 creates a gap 99 between deflector 70 and module 30, located at apex 98 where the fluid velocity is high and the pressure is low, thereby connecting the underside of PV modules 30 with the low pressure zone at apex 98. This arrangement may draw air out of gap 99 as indicated by the upward arrow at apex 98 and may further result in lower pressure on the underside of PV modules 30 and a reduction in total lift. Similar effects may also result when the wind direction is other than shown.

FIGS. 1 and 9-11 show a weight or ballast holding, supporting or carrying device, such as ballast pan 80 and one or more heavy object(s), block(s), stone(s), sand, or highly dense material(s), such as ballast block 81. As shown in FIG. 9, ballast pan 80 may link high-side horizontal flange 50 with a corresponding low-side horizontal flange 52 on a next row of supports 40. Ballast pan 80 may be approximately the same width as or slightly less than the width of support 40 as shown in FIG. 1 and may comprise substantially vertical walls 82. Walls 82 may be of sufficient rigidity along the z-axis to prevent ballast pan 80 from sagging under the weight of blocks 81 and thereby maintaining a gap 83 between roof 10 and ballast pan 80. Gap 83 may reduce costs of a photovoltaic array mounting apparatus or system, since protective material such as a slip sheet may not be required between ballast pan 80 and roof 10. Ballast pan 80 may be sized to carry anywhere from 1 to 5 ballast blocks 81 (or more), thereby enabling the easy addition of weight as needed to resist uplift forces.

Figure 12:
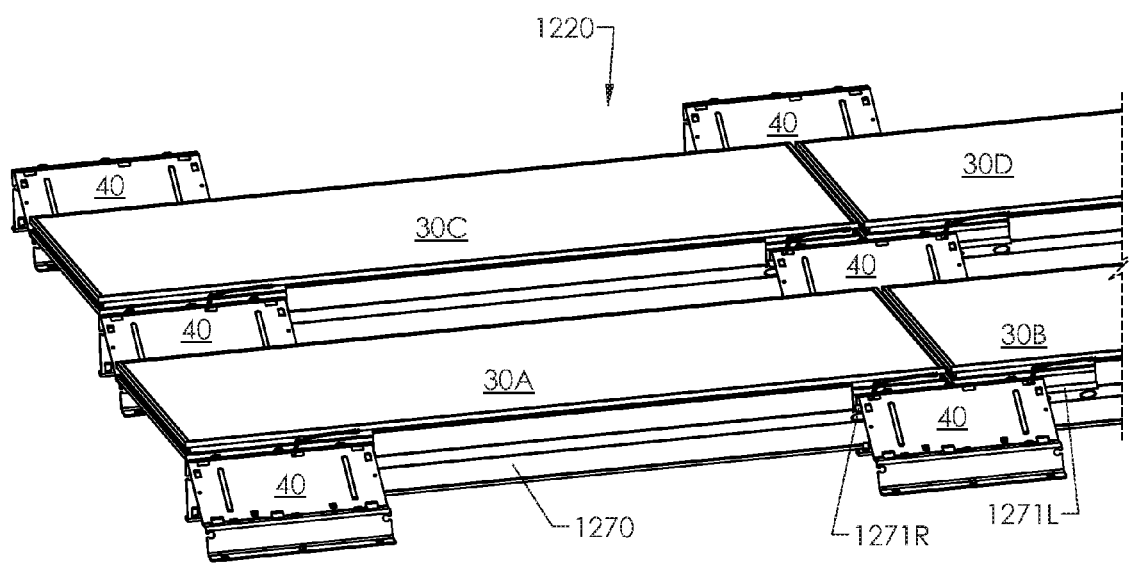
FIG. 12 is an isometric view of a portion of a PV array on a flat or low-slope surface.

FIG. 12 shows a perspective view of an embodiment of a PV system 1220, similar to that shown in FIGS. 1-11, except wind deflector 70 is replaced by wind deflector 1270. Wind deflector 1270 is similar to deflector 70 except that perforated portions 79 are not present and flaps 71L, 71R have been replaced with flaps 1271L, 1271R, which are similar but longer. Lone flaps 1271L, 1271R allow for sliding-in of supports 40 at the end of a row without having to bend perforated portions 79 as described above. For example, support 40 at the end of the row on the high side of PV module 30a is shown in a position that is essentially fully underneath PV module 30a and covering most of flap 1271L; whereas support 40 between PV modules 30a and 30b is roughly centered between the two PV modules and thus a substantial portion of flap 1271L is showing/exposed (to the right of support 40 in FIG. 12).

Figure 13:
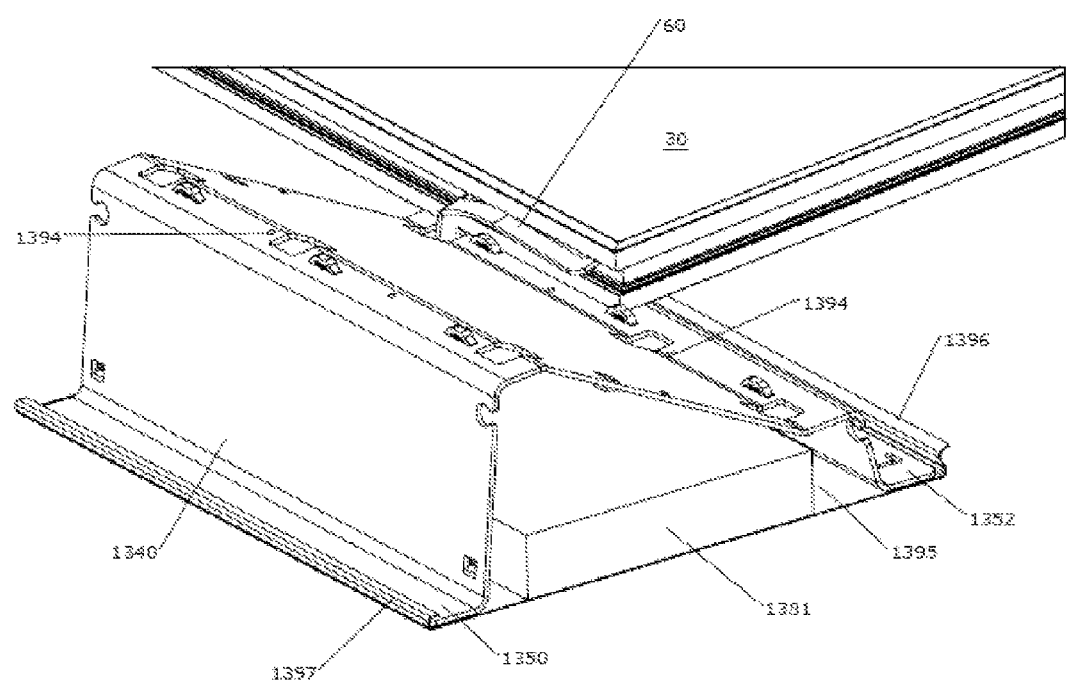
FIG. 13 is an isometric view of a support connected to the groove of a PV module frame by a clip.

FIG. 13 shows a perspective view of an embodiment of a support 1340 supporting PV module 30. Support 1340 may be similar to support 40 except that support 1340 may further comprise a ballast support device or ballast tray 1395 located substantially beneath support 1340. Ballast tray 1395 may comprise one or more ballast blocks 1381, a channel 1397 and a lip 1396. Support 1340 may comprise high-side horizontal flange 1350 and low-side horizontal flange 1352, which may be similar to flanges 50 and 52 except optimized for connection to ballast tray 1395. Ballast tray 1395 may be connected to support 1340 prior to installation of PV module 30, as by laying tray 1395 on roof 10, lifting support 1340 up, angling support 1340 slightly downward on the high side, inserting flange 1350 into channel 1397, and then pushing down on a low side to snap flange 1352 behind lip 1396.

Figure 14:
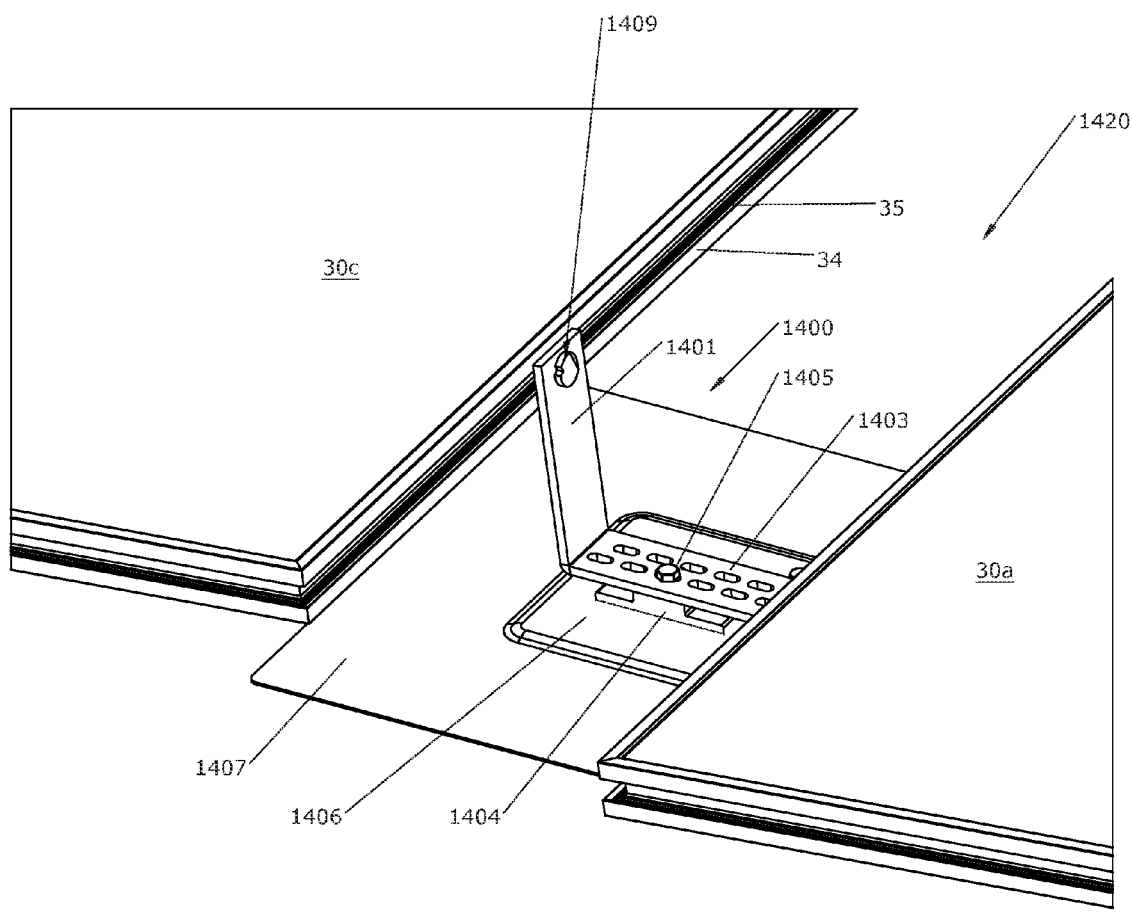
FIG. 14 is an isometric view of a bracket connecting a PV array to a surface.
Figure 15:
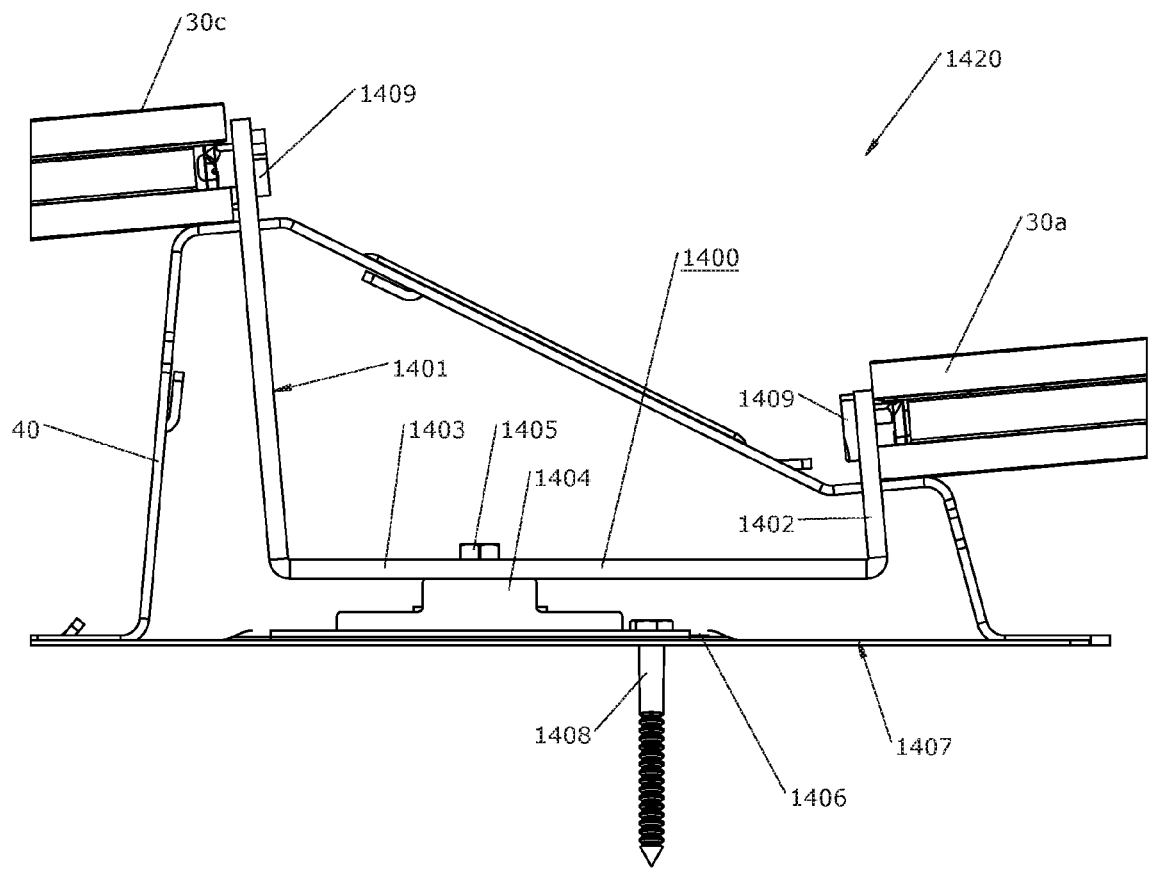
FIG. 15 is an orthogonal view of the contents of FIG. 14.

FIGS. 14-15 show an embodiment of a positive attachment device for use as a replacement for wind deflector 70 and/or ballast pan 80 or as a complement to wind deflector 70 and/or ballast pan 80 in the embodiments shown in FIGS. 1-11. It is known in the art to utilize a positive attachment mechanism, such as a screw, to connect a PV system to a roof or other structure. However, the instant disclosure shows a novel means, apparatus, systems or structures for providing positive attachments by utilizing a variably positionable bracket that connects directly to a low-side and/or a high-side of PV module frames.

FIG. 14 shows a perspective view of a PV system 1420 comprising PV modules 30, supports 40 (not shown), and a positive attachment device or variably positionable bracket, such as bracket 1400. FIG. 15 shows a side view of PV system 1420. In this example, bracket 1400 effectively replaces a support 40 from the end of a row of PV modules 30. One of skill in the art will recognize that brackets 1400 may also be placed in other locations within a row of PV modules 30, in many places between supports 40. In some embodiments where seismic loads are significant, brackets 1400 may be distributed throughout PV system 1420, for example to resist lateral seismic loads. In other embodiments bracket 1400 completely replace some or all supports 40.

Bracket 1400 may comprise a generally U-shaped profile having a base 1403, a high-side vertical portion 1401, and a low-side vertical portion 1402. Other embodiments provide other shapes that still achieve the same basic functionality as described above and/or below. Vertical portions 1401 and 1402 may be connected to PV modules 30 via fastener 1409. In the instant disclosure fastener 1409 may be a quarter-turn device that may lock into groove 35 in frame 34 to secure bracket 1400 to both PV modules 30c and 30a. Fastener 1409 may connect substantially anywhere along a length of frame 34, thereby allowing bracket 34 to be variably positioned in order to align bracket 1400 with a structural member and/or optimally position bracket 1400 with respect to resisting loads presented to PV modules 30. Bracket 1400 may further comprise a block 1404 a base plate 1406 and a flashing or roofing material 1407. Base 1403 may comprise holes or slots to accommodate a fastener 1405 for connecting bracket to a block 1404 and base plate may comprise one or more fasteners 1408 for connecting to a structure, such as a sheathing, a purlin, a girder, a beam, a rafter, or the like, below.

Figure 16:
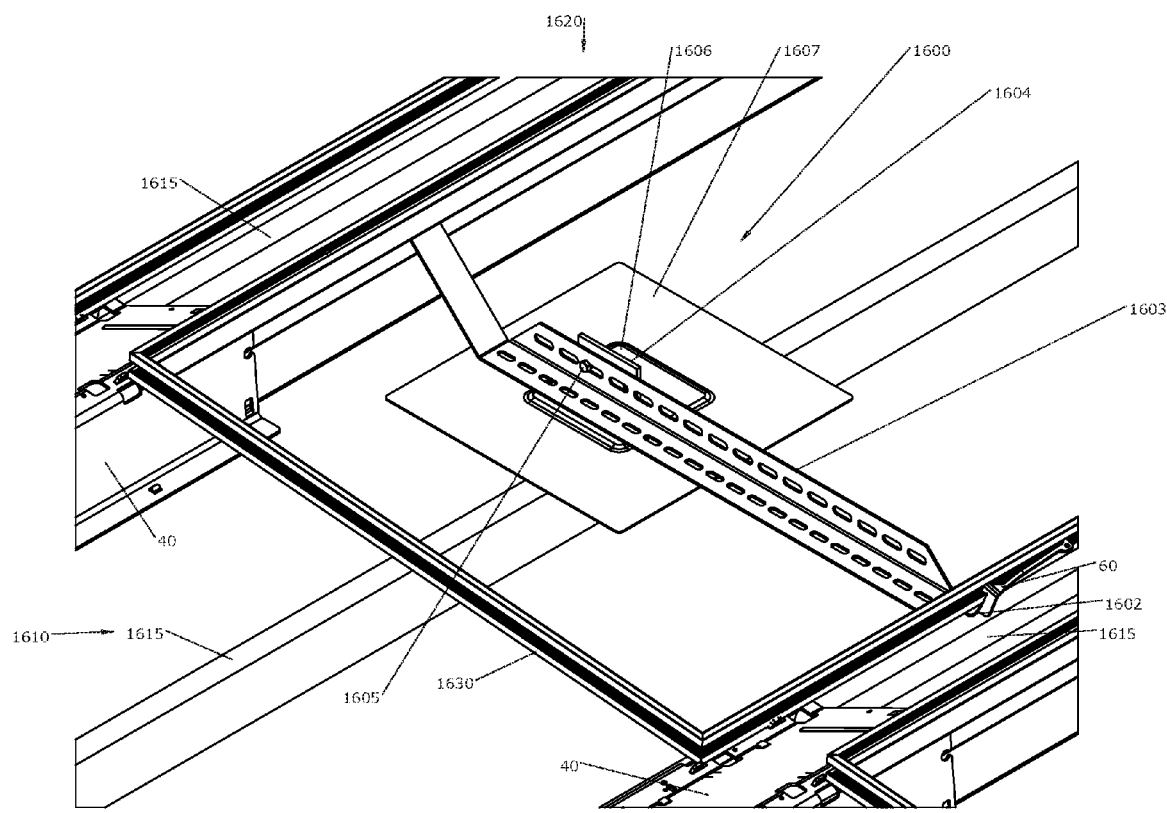
FIG. 16 is a perspective view of a PV system with an alternate bracket.
Figure 17:
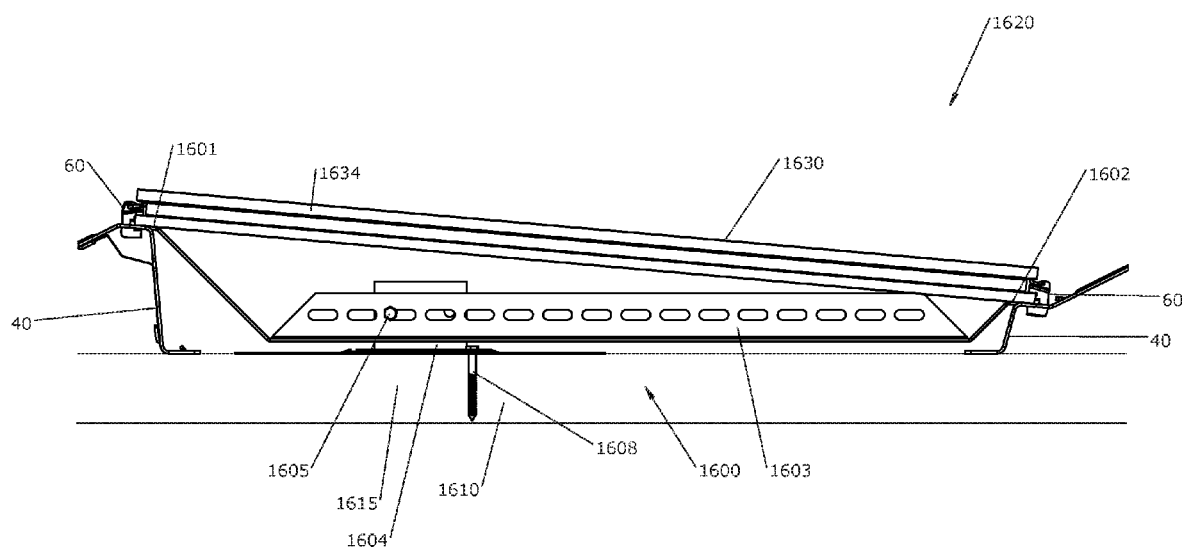
FIG. 17 is an orthogonal view of the contents of FIG. 16.

FIGS. 16-17 show an embodiment of a positive attachment device or bracket 1600 that achieves similar functionality to bracket 1400, except bracket 1600 may be located beneath PV modules 30 instead of between PV modules 30, and bracket 1600 may be variably positioned along both the x and y axes.

FIG. 16 shows a perspective view of a PV system 1620 that is similar to PV system 1420 except that bracket 1400 is replaced by bracket 1600. FIG. 16 also includes PV modules 1630 which are essentially the same as PV modules 30 except that the PV laminate has been removed from the view for clarity and so that bracket 1600 below may be revealed. In an actual installation, PV modules 1630 may be replaced by PV modules 30. FIG. 16 also shows roof 1610 as only comprising rafters 1615 (no sheathing is shown). Other embodiments comprise roofs with other typical roof structures. FIG. 17 shows a side view of PV system 1620.

Bracket 1600 may comprise a long member 1603 spanning most of the width of PV module 1630 and comprising slots or holes for receiving fastener 1605 which may connect long member 1603 to block 1604. Bracket 1600 may further comprise upper flat portion 1601 and lower flat portion 1602 that run approximately in the plane (or an essentially parallel plane) of PV module 1630, are located essentially directly beneath PV module frame 1634, and may be connected to frame 1634, as via lever clips 60. Bracket 1600 may further comprise a base plate 1606 (FIG. 16) and a flashing or roofing material 1607 (FIG. 16). Base plate 1606 may comprise one or more fasteners 1608, as for connecting to rafter 1615. Bracket 1600 may be variably positioned along the x-axis by connecting substantially anywhere along a length of frame 1604 via lever clips 60. Block 1604 may be variably positioned along the y-axis by connecting fastener 1605 through different holes or slots in member 1603. Thus, bracket 1600 has the ability to vary the connection point for fastener 1608 along one or both the x and y axes, enhancing the flexibility for where bracket 1600 connects to rafters 1615.

Figure 18:
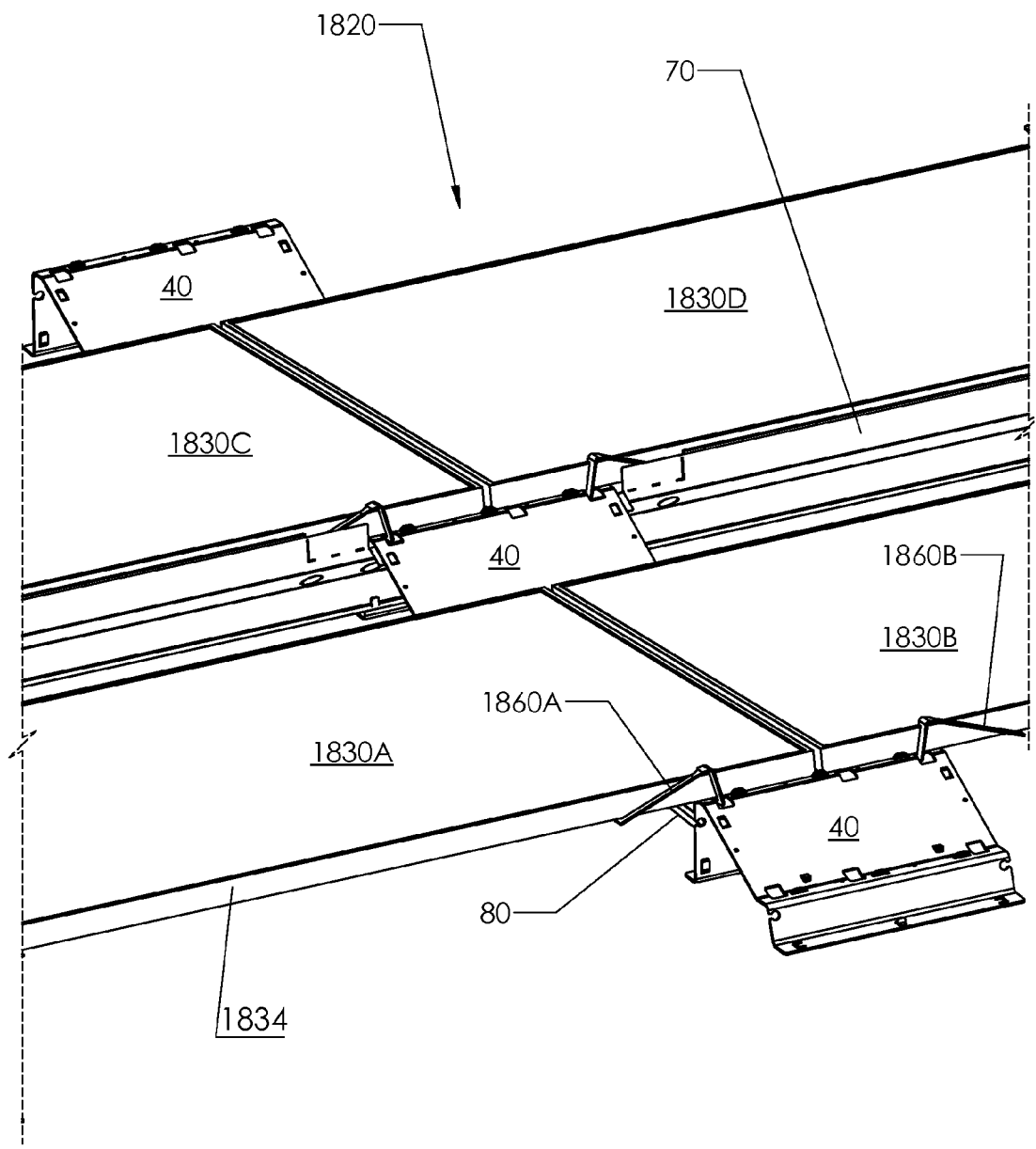
FIG. 18 is an isometric view of a PV array on a flat or low-slope surface where the frames of the PV modules lack grooves.
Figure 20:
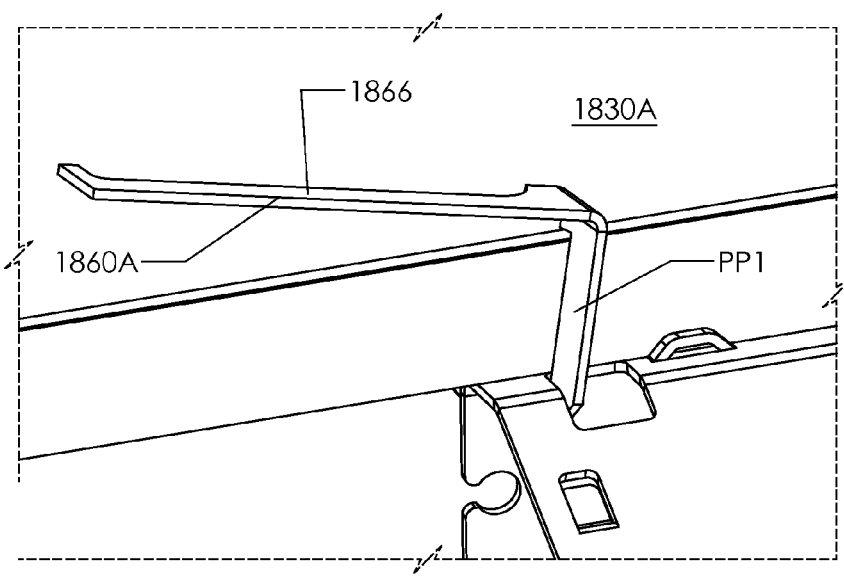
Figure 21:
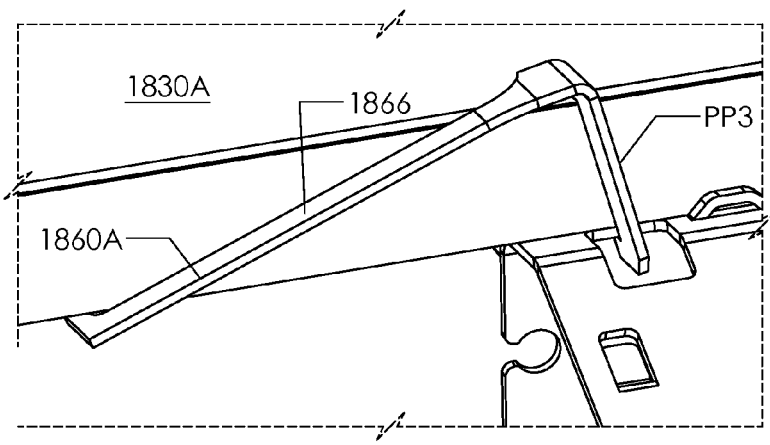
Figure 22:
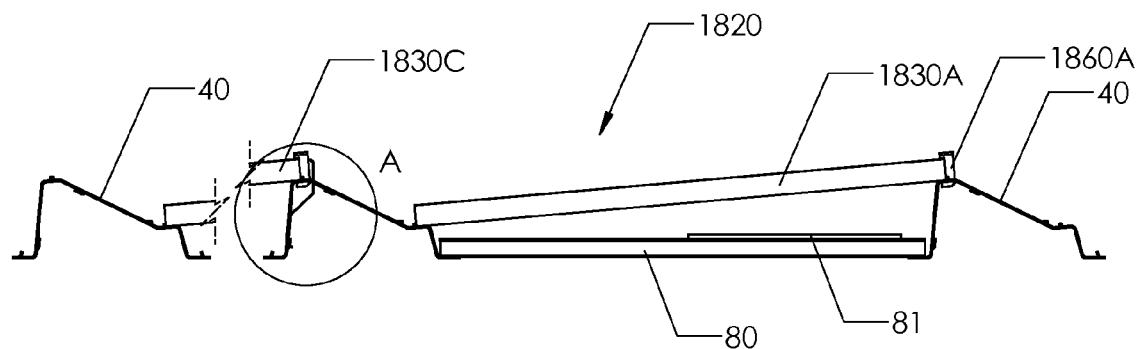
FIG. 22 is an orthogonal view of a PV array on a flat or low-slope surface where the PV modules lack a groove.
Figure 23:
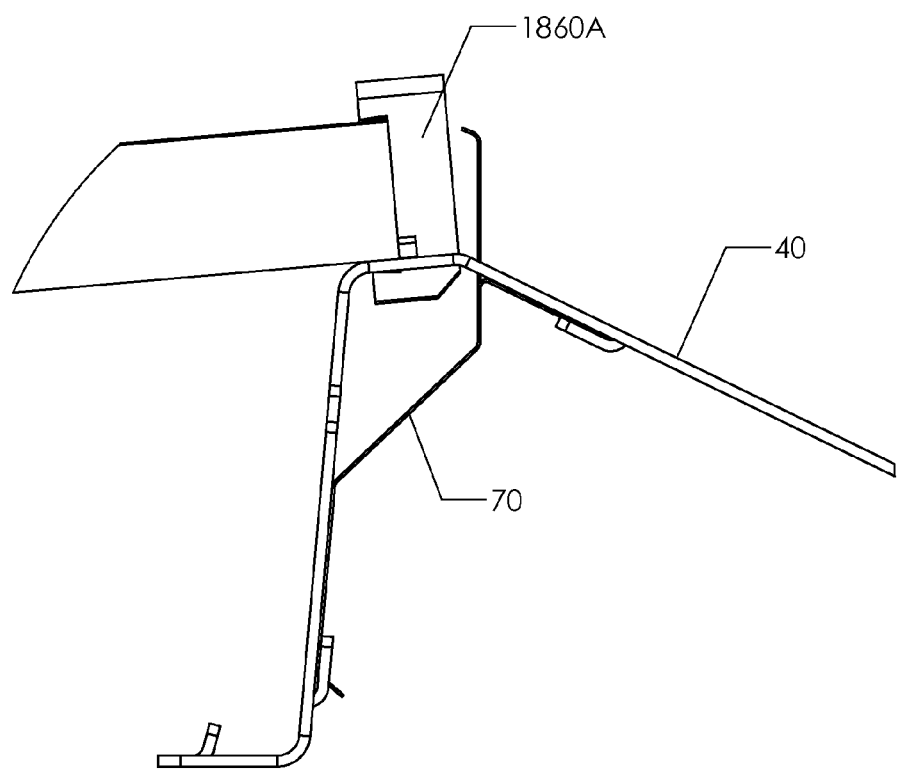
FIG. 23 is an enlargement of a portion of FIG. 22.

FIGS. 18-23 show an embodiment of a PV system 1820 comprising PV modules with no groove on the outside surface, such as PV modules 1830a, 1830b, 1830c, 1830d. FIG. 18 shows a perspective view of PV system 1820, FIG. 22 shows a side view of PV system 1820, and FIG. 23 shows a close-up of the portion of FIG. 22 inside the circle A. PV system 1820 comprises many of the same elements as PV system 20, including but not limited to, supports 40, wind deflectors 70, and ballast pans 80. As noted above, lever clips may come in mirror image variants that reverse the direction of rotation of the clip during installation. PV system 1820 provides an example of how pairs of such lever clips may work together in a system. PV system 1820 may comprise a counterclockwise-rotating lever clip, such as lever clip 1860a, and a clockwise-rotating lever clip, such as lever clip 1860b. Lever clip 1860b may work in a very similar manner to lever clip 60 except that: (a) notch 68 is replaced by notch 1868 which is wider and thus capable of going around an entire PV module frame 1834 and upper pedestal 41, (b) spring arm 1866 may be stiffer than spring arm 66 and bends very little when rotated into a final position, and (c) tab 1867, which replaces tab 67, may be optimized to catch underneath frame 1834 instead of inside a groove 35 of frame 34.

Figure 19:
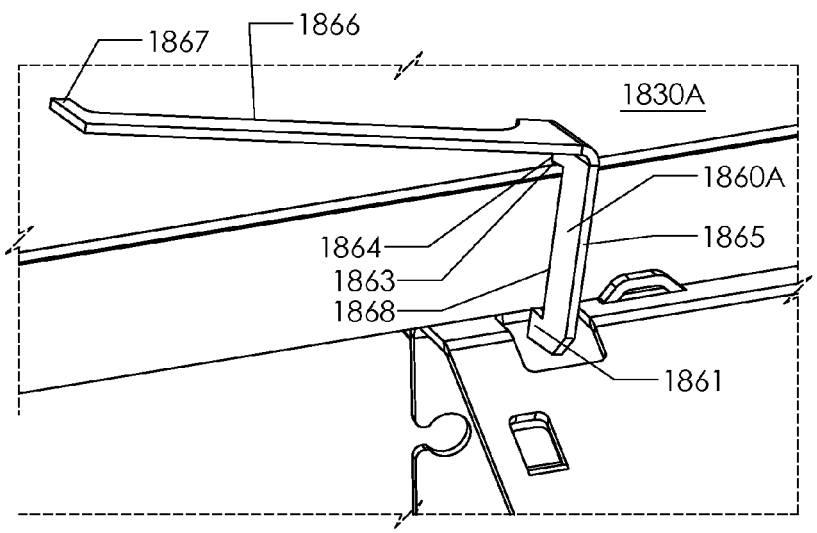
FIGS. 19-21 are progressive views of a clip engaging a frame and a support where the frame lacks a groove.

FIGS. 19-21 show perspective views of an exemplar installation sequence for lever clip 1860a. In FIG. 19 lever clip 1860a is shown completely unattached and ready to be installed. Note head 1865, which is similar to head 65, comprises upper lip 1864 and lower lip 1861 which function essentially the same as upper and lower lips 64 and 61 respectively except that the direction of rotation is reversed so edges 1862 (not viewable here) and 1863 are on the opposite sides from edges 62 and 63 and, since spring arm 1866 is stiffer, edges 1862 and 1863 may cut into frame 1834 deeper than edges 62 and 63 when being rotated into position. FIG. 20 shows lever clip 1860a inserted and in position PP1, which is effectively the same as position P1 except that a different lever clip is being installed. FIG. 21 shows lever clip 1860a fully rotated and locked in at position PP3, which is effectively the same as position P3 except that a different lever clip is being installed. Note that stiff spring arm 1866 is essentially straight in position PP3 with most of the pre-load, as discussed above, being provided by the cutting in of edges 1862 and 1863, and the inherent spring back force that frame 1834 provides beneath edges 1862 and 1863. While the instant embodiment demonstrates lever clips that are opposite with respect to the engaging direction of rotation, one of skill in the art will also recognize that other variants are also within the scope of the instant disclosure. For example, in other embodiments spring arm 1866 connects to the head of lever clip 1860a at the bottom near lip 1861 instead of at the top near lip 1864, thereby resulting in an installation action whereby the installer pulls upward and attaches tab 1867 on top of frame 34 instead of underneath it.

Figure 24:
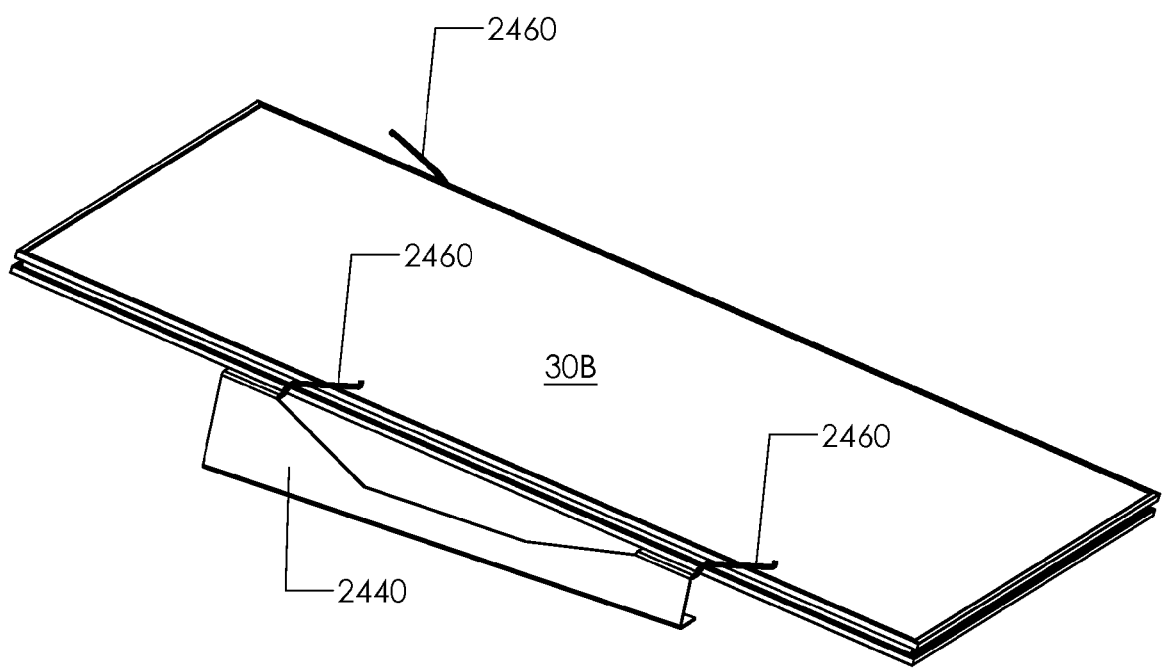
FIG. 24 is a perspective view of a PV module mounted in portrait position.
Figure 25:
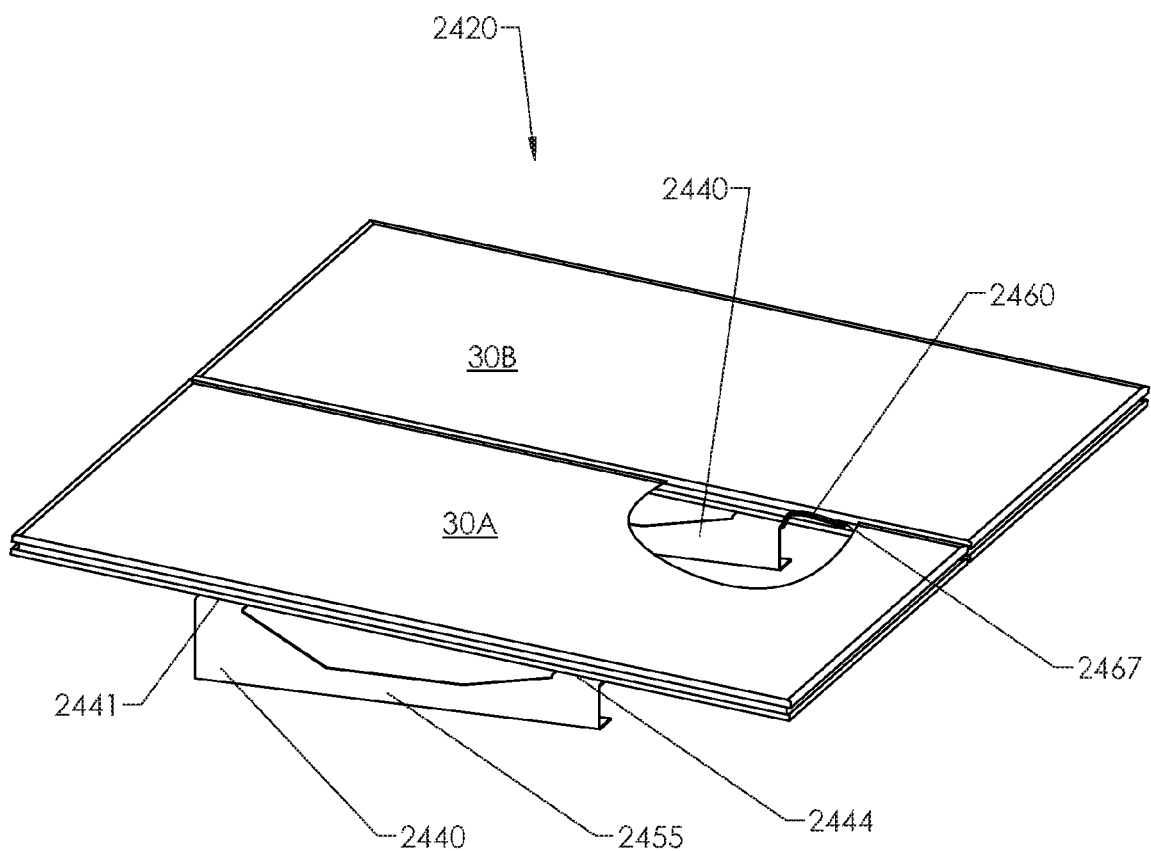
FIG. 25 is a perspective view of two adjacent PV modules mounted in portrait position.

FIGS. 24-29 show an embodiment of PV system 2420 which may be similar to PV system 20 except the locations and orientation of certain equipment may be different and lever clip 60 and support 40 may be slightly altered or modified. FIG. 24 shows a perspective view of a first PV module 30b of PV system 2420 in the process of being installed and FIG. 25 shows a perspective view with PV module 30b installed and a second PV module 30a being installed. A portion of PV module 30a is shown removed in FIG. 25 to reveal components below.

PV system 2420 shows PV modules 30 tilted around the x-axis, as in PV system 20, except here PV modules 30 are tilted such that the short side of each PV module 30 is the high side (thus modules are oriented in a portrait configuration instead of landscape with respect to the y-axis). One of skill in the art will recognize that both PV system 20 and PV system 2420 may be oriented in either landscape or portrait configuration (or other configuration, including combinations).

Support 2440 may be similar to support 40 except that it may be supporting PV modules 30 along their y-axis edges instead of along their x-axis edges. Support 2440 may comprise a body portion 2455 extending along and substantially beneath adjacent edges of PV modules 30a and 30b. Body portion 2455 may comprise an upper pedestal with a platform angled around the x-axis, such as upper pedestal 2441, and a lower pedestal with a platform at approximately the same angle and in approximately the same plane as upper pedestal 2441, such as lower pedestal 2444. PV modules 30 may be placed onto and supported by upper and lower pedestals 2441 and 2444.

Figure 26:
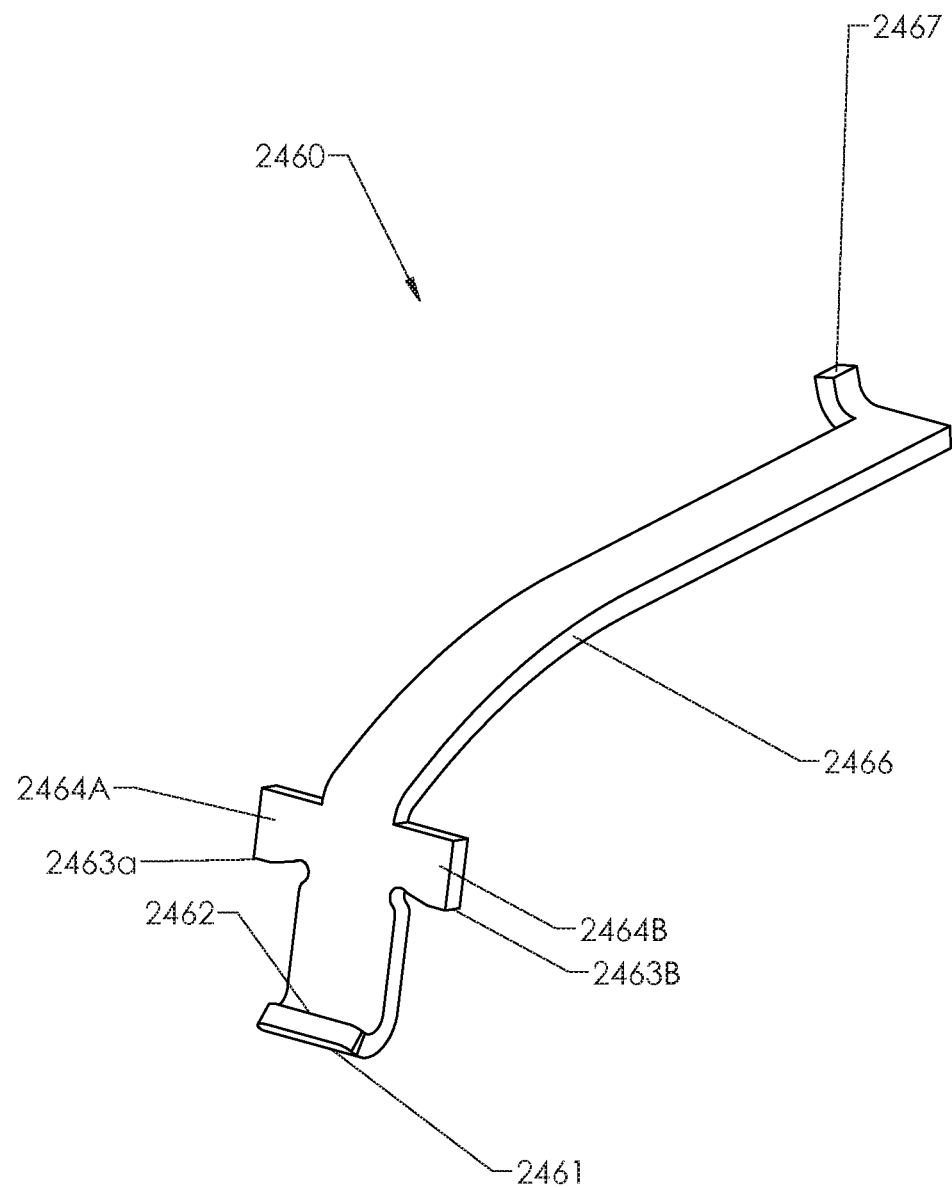
FIG. 26 is a perspective view of a clip.

PV system 2420 may further comprise lever clips similar to lever clips 60 but adapted to work with supports 2440. FIG. 26 shows a perspective view of a bracket, spring clip, "dream clip", "T-Lock", "J-Lock", lock, spring arm device, spring bracket, pivot-lock clip, lever clamp, or lever clip, such as lever clip 2460. Lever clip 2460 may be similar to lever clip 60 except lip 64 may be replaced by lips 2464a and 2464b so that two PV modules 30 may be connected simultaneously and lip 61 may be replaced by lip 2461 so that an orthogonally located support portion (instead of one that is parallel to an edge of PV module 30) may be connected to PV module 30. Lips 2464a and 2464b may comprise corresponding edges 2463a and 2463b that serve a similar function to edge 63 when clip 2460 is installed. Lip 2461 may comprise an edge, such as edge 2462, that performs a similar function as edge 62, except that edge 2462 may press against an underside of a support that is crossing module 30 edge orthogonally, such as upper pedestal 2441 or lower pedestal 2444.

Figure 27:
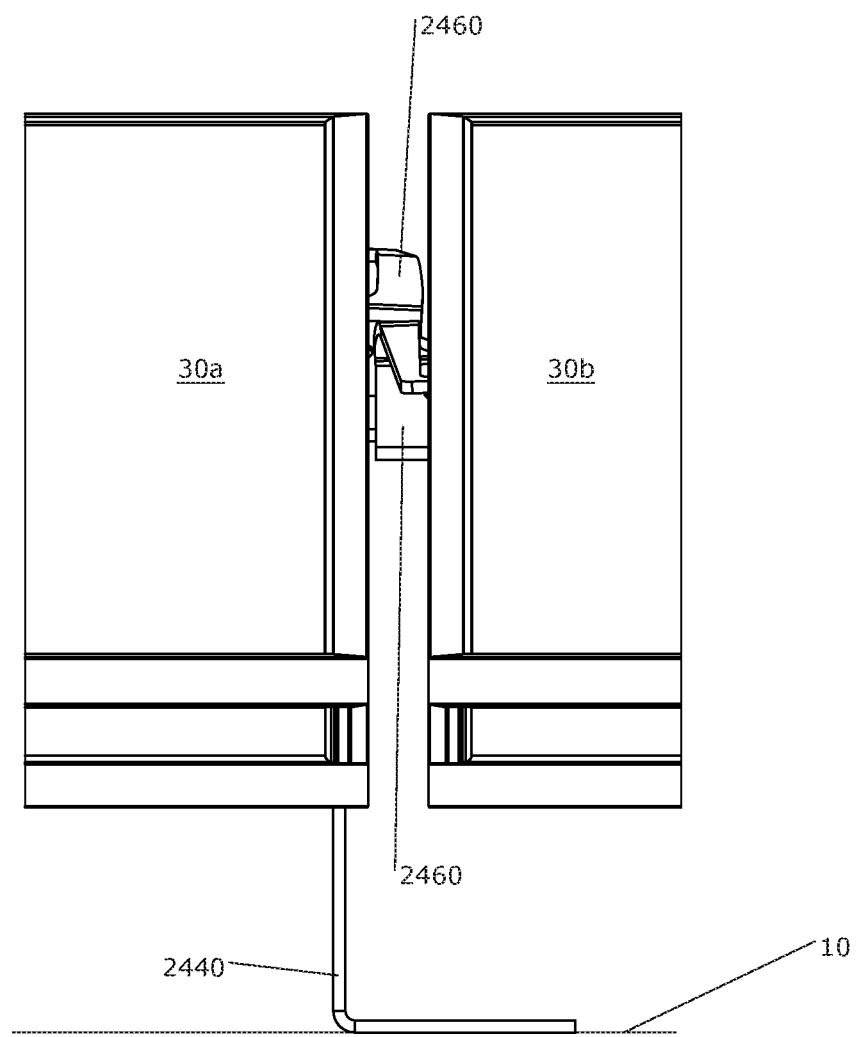
FIG. 27 is an incline view of two clips installed between two adjacent PV modules.
Figure 28:
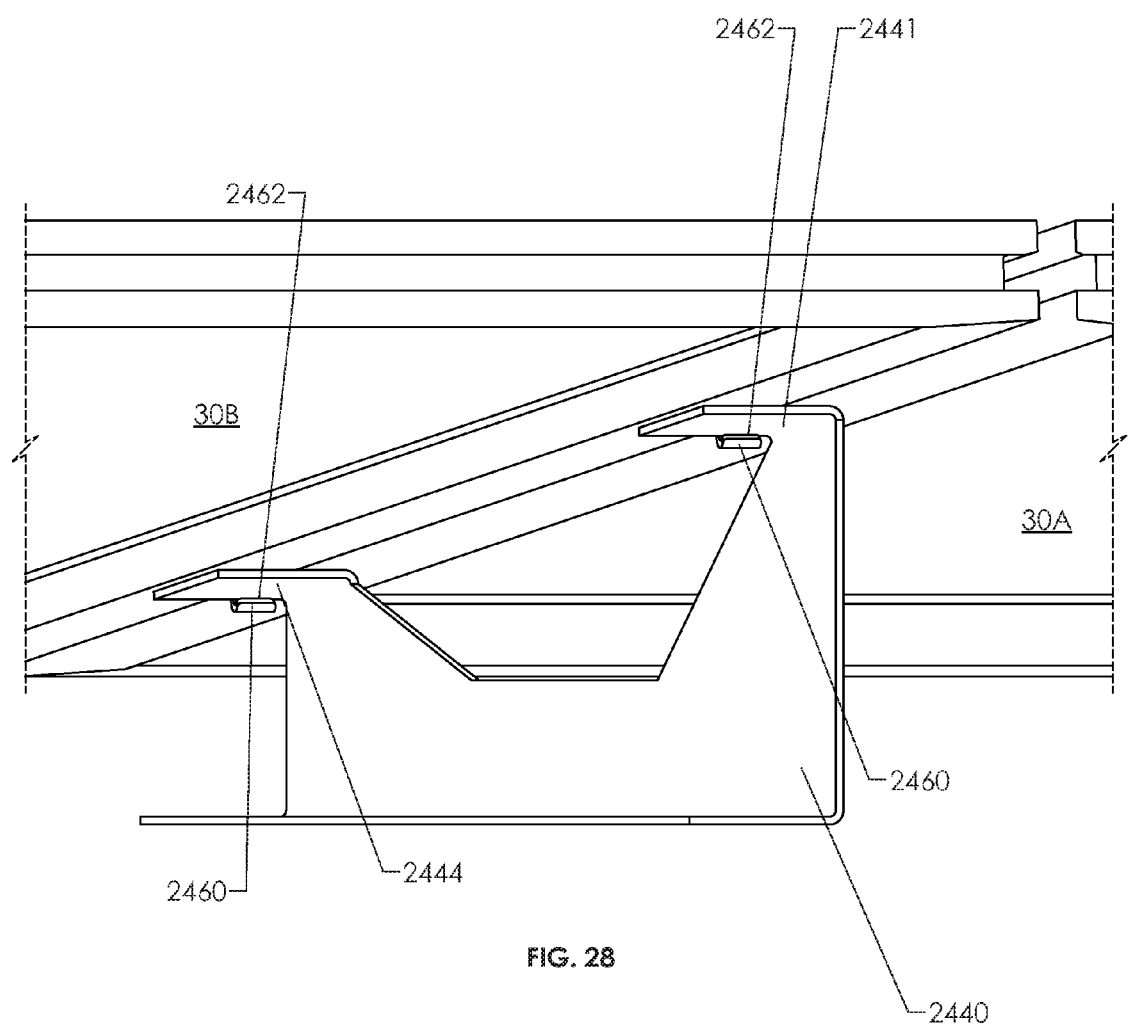
FIG. 28 is a bottom view of two clips installed between two adjacent PV modules.

FIG. 27 shows a front view close-up showing the area between PV modules 30a, 30b as shown in FIG. 25. FIG. 28 shows a perspective view from beneath PV system 2420 in the area near support 2440.

PV system 2420 may be installed as follows, in a step-by-step-based process similar to those described above. Supports 2440 may be placed onto a surface, such as roof 10. PV module 30b may be placed onto two supports 2440 as shown in FIG. 24 (second support not visible here, but it is located beneath the edge opposite of the edge being supported by the viewable support 2440). Lever clips 2460 connecting PV module 30b to support 2440 (the one not viewable) may be fully installed since this may end up as, or become, the end-module on a row of PV modules 30. Next, another support 2440 is placed approximately one-module's width over from module 30b, and then module 30a is placed thereon as shown in FIG. 25. With both modules 30a, 30b in place, lever clips 2460 located in the space between PV modules 30a, 30b may be rotated into position 3 (see above), thereby connecting PV modules 30a and 30b to support 2440. FIGS. 27 and 28 provide additional views of a gap between PV modules 30a, 30b with lever clips 2460 connecting PV modules 30a, 30b to upper and lower pedestals 2441 and 2444, respectively.

Figure 29:
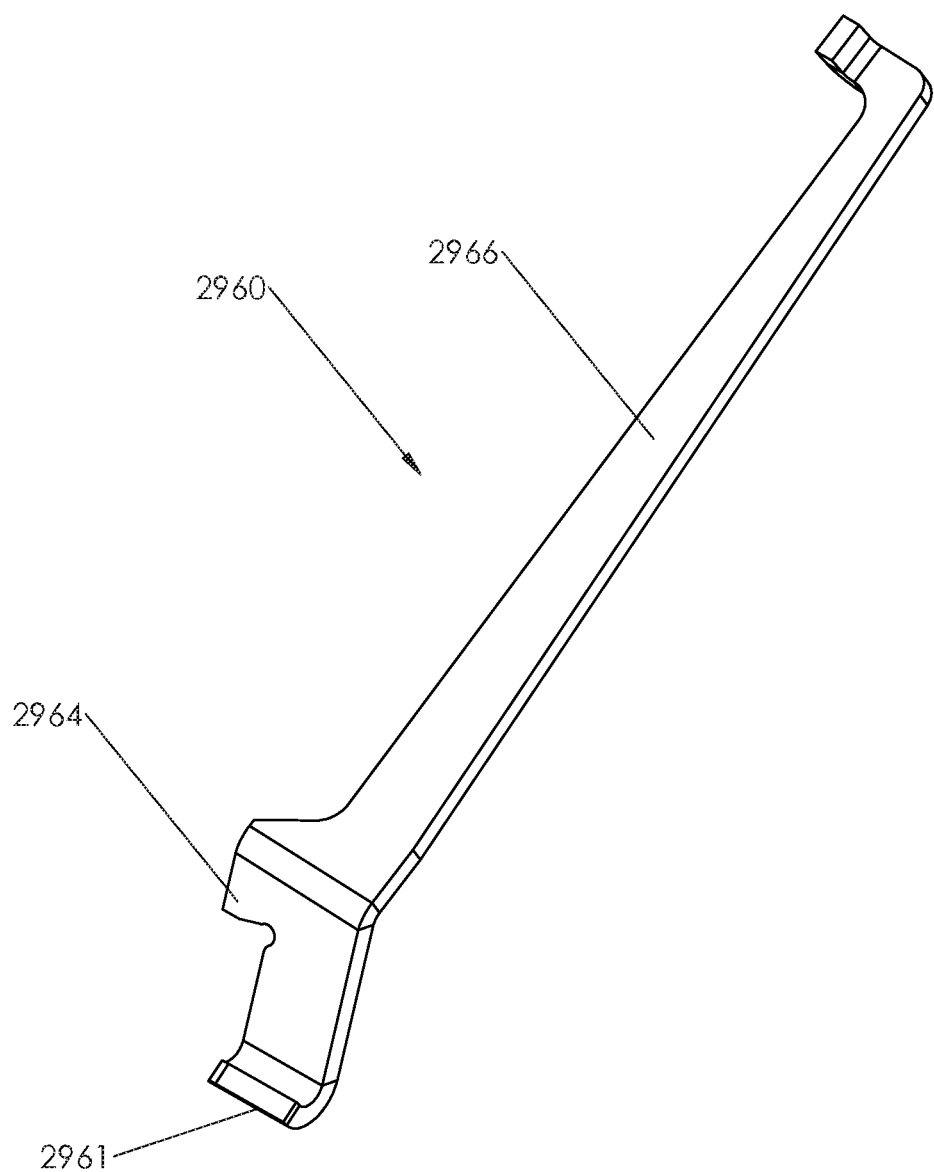
FIG. 29 is a perspective view of a clip.

In an embodiment similar to PV system 2420, lever clip 2460 is replaced by lever clip 2960 as shown in the perspective view of FIG. 29. Lever clip 2960 is similar to lever clip 2460 except that lip 2464b has been removed, thereby removing the ability for this embodiment of a lever clip to simultaneously connect two PV modules to a support. This difference may have advantages in some situations. For example, when installing lever clips 2960 according to the installation procedure described above for PV system 2420 (except substituting lever clips 2960 for lever clips 2460), an installer may fully secure supports 2440 to each module 30 independently, thereby preventing the need for aligning PV modules 30a, 30b prior to installing lever clip 2960. Lever clips 2960 may be installed on opposite sides of upper and lower pedestals 2441 and 2444 and in opposite directions, which may result in better performance under certain shear loads.

Figure 30:
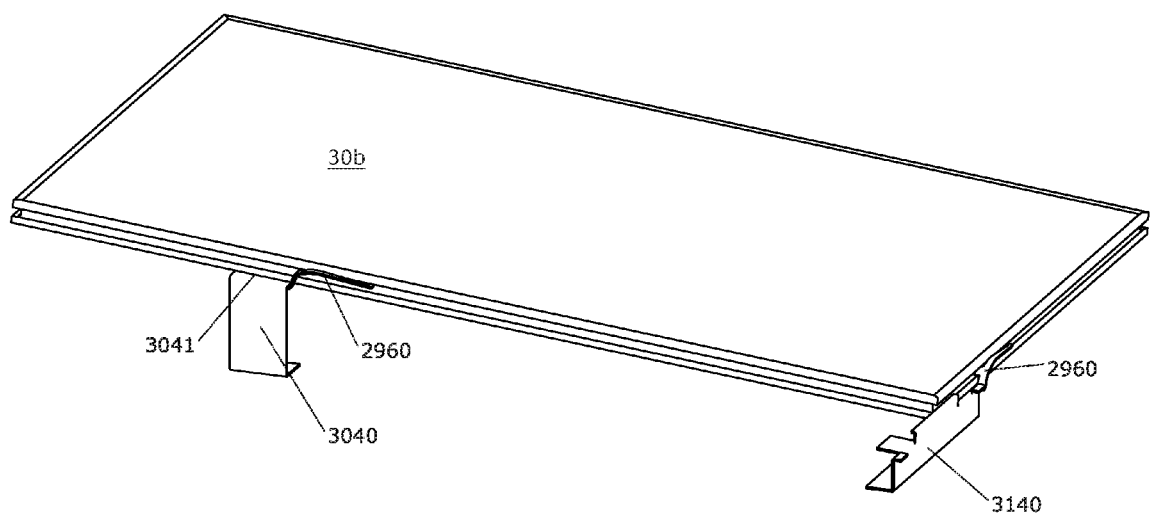
FIG. 30 is a perspective view of a PV module mounted in portrait position.
Figure 31:
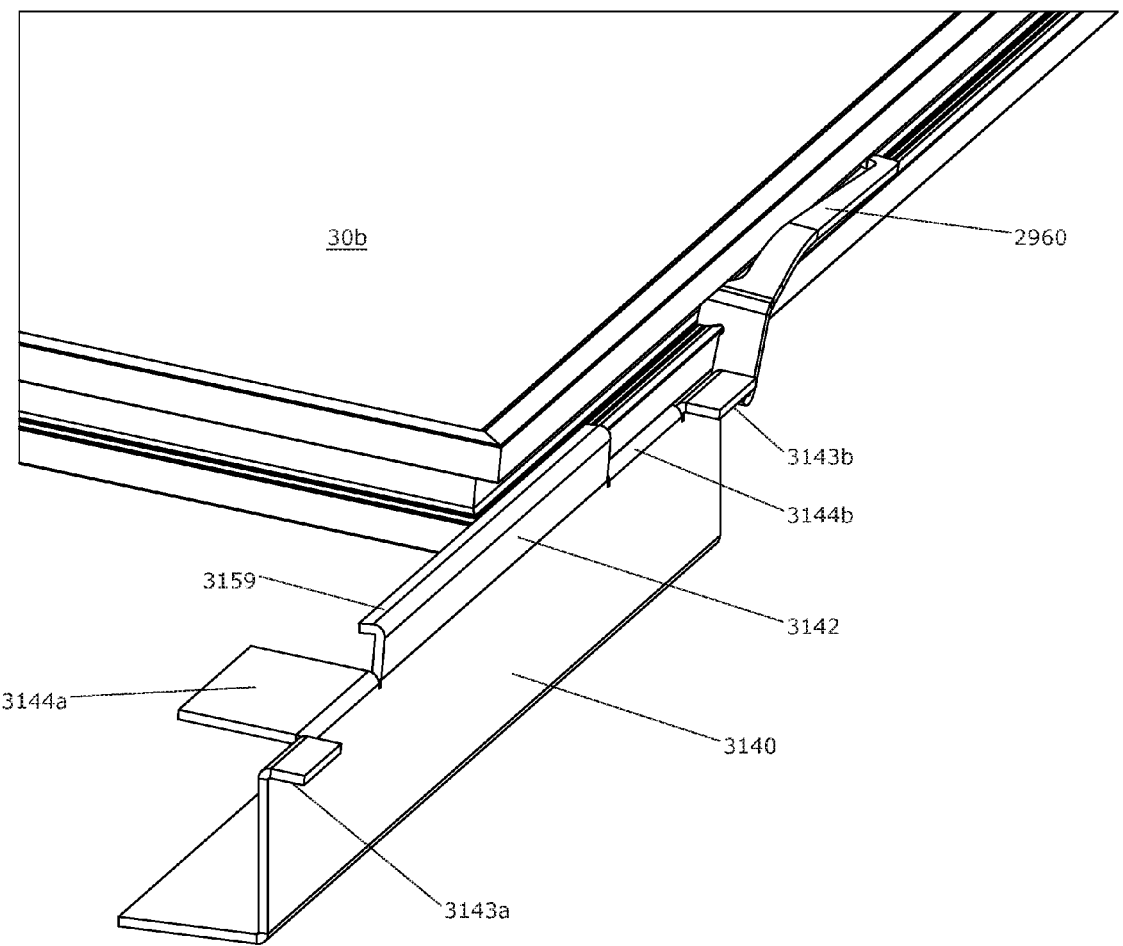
FIG. 31 is an enlarged view of a portion of FIG. 30.
Figure 32:
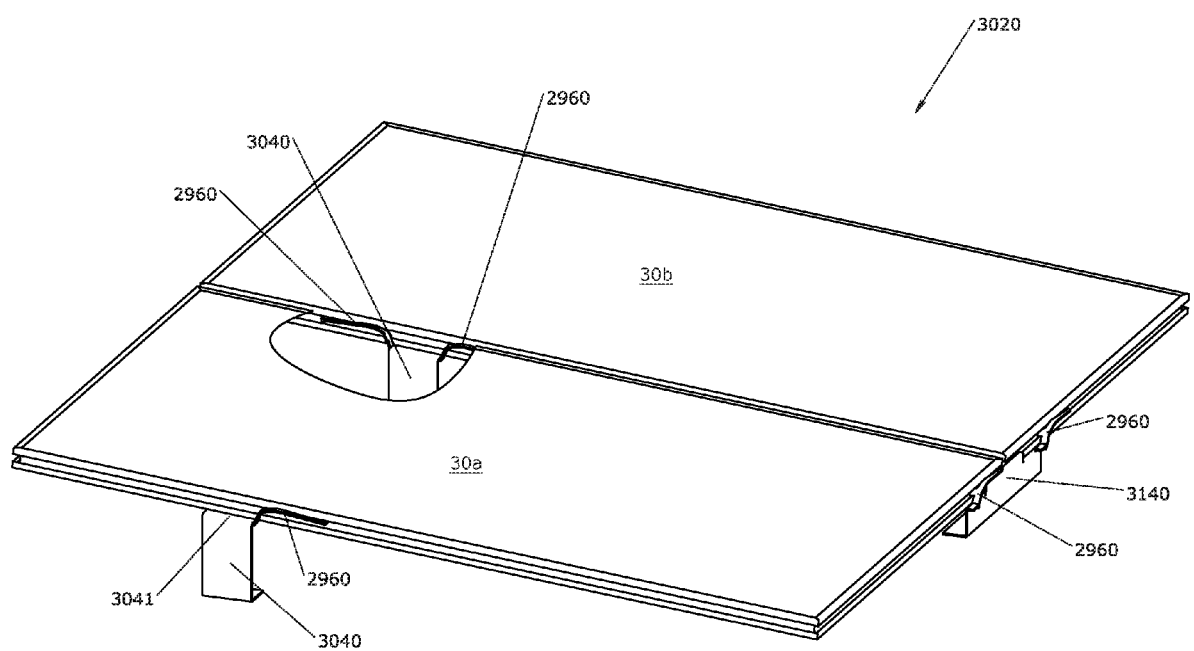
FIG. 32 is a perspective view of two adjacent PV modules mounted in portrait position.

FIGS. 30-32 show an embodiment of a PV system 3020 that is similar in certain respects to PV system 20 and PV system 2420. For example, PV system 3020 may comprise supports along both x-axis PV module 30 edges and y-axis PV module 30 edges (instead of one or the other).

FIG. 30 shows a perspective view of a first PV module 30b of PV system 3020 in the process of being installed and FIG. 32 shows a perspective view with PV module 30b of PV system 3020 already installed and a second PV module 30a of PV system 3020 being installed. A portion of PV module 30a is shown removed in FIG. 32 to reveal components below. FIG. 31 shows a perspective view of a close-up of a corner of PV module 30b from FIG. 30 (corner comprising a support as discussed below).

PV system 3020 shows PV modules 30 tilted around the x-axis, as in PV system 2420. Support 3040 may be similar to support 2440 except that it may be shorter and only intended to support PV module 30 in one location instead of two as with support 2440. For example, as shown in FIG. 32, supports 3040 may primarily provide support to the upper portions of PV modules 30a, 30b, whereas a second support, shown as support 3140, may provide support for lower portions of PV modules 30a, 30b. Support 3040 may comprise an upper pedestal with a platform angled around the x-axis, such as upper pedestal 3041, which may be adapted to connect to PV modules 30 via a lever clip, such as lever clip 2960, and may be similar in terms of functionality to upper pedestal 2441.

PV system 3020 may further comprise a lower support for supporting one or two PV modules along a lower edge, such as support 3140. As shown in FIG. 31, support 3140 may comprise two lower pedestals, such as lower pedestals 3144a and 3144b, each for supporting a lower edge of a PV module 30 and each in approximately the same plane as upper pedestals 3041 when PV system 3020 is installed on a relatively flat surface. Upper pedestals 3041 and lower pedestals 3144a, 3144b may connect to PV modules 30 via lever clips 2960 as described above. Support 3140 may further comprise a substantially vertical portion 3142 and a flange 3159, which may be used, for example, to provide additional resistance to uplift loads. Flange 3159 may be inserted inside groove 35 or above frame 34 so long as it provides a positive stop to resist upward movement of PV module 30.

PV system 3020 may be installed as follows. Supports 3040 and 3140 may be placed onto a surface, such as roof 10. PV module 30b may be placed onto two supports 3040 as shown in FIG. 30 (second support not visible here, but it is beneath the edge opposite of the edge being supported by the viewable support 3040) and one support 3140. Both lever clips 2960 connecting PV module 30b to supports 3040 (one visible and one not visible here) and lever clip 2960 connecting PV module 30b to support 3140 may be fully installed as shown in FIG. 31. Next, another support 3040 and another support 3140 are placed approximately one-module's width over from module 30b, and then module 30a is placed thereon as shown in FIG. 32; the second support 3140 is not shown here as it may not be required at the end of a row. In other embodiments a support 3140 is used at the end of a row and it is slid inward from the position shown in FIG. 30 such that it does not protrude from the end of the row. The installation as shown in FIG. 32 is completed by connecting PV module 30a to supports 3040 and 3140 (if utilized at the end of the row) with lever clips 2960.

Figure 33:
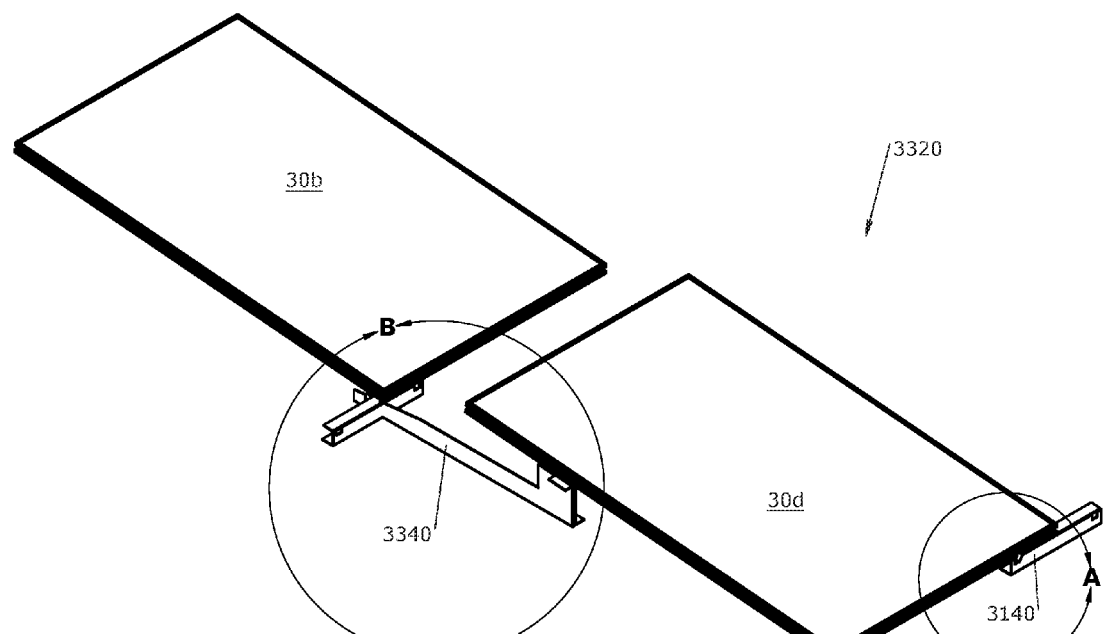
FIG. 33 is an isometric view of two consecutive PV modules mounted in portrait position.
Figure 34:
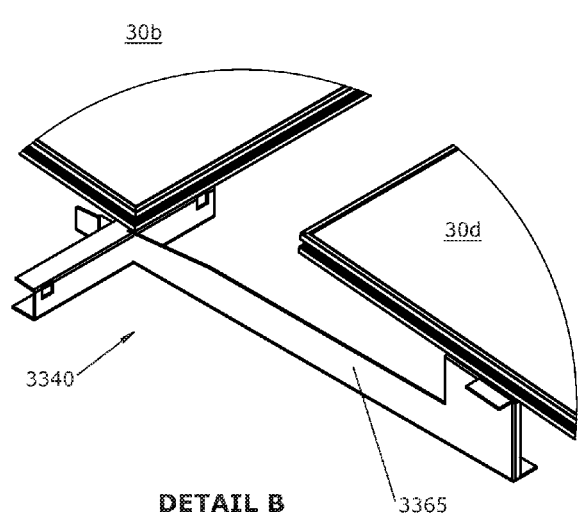
FIG. 34 is an enlarged view of a portion of FIG. 33.
Figure 35:
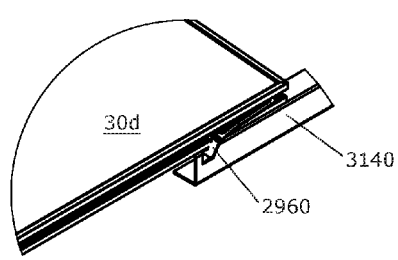
FIG. 35 is an enlarged view of a portion of FIG. 33.

FIGS. 33-35 show an embodiment of a PV system that is similar to PV system 3020 except that supports 3040 and 3140 are replaced by a support 3340 that combines the functionality of supports 3040 and 3140 into one part and links them by a bar 3365 that may provide a structural connection between rows. FIG. 33 shows a perspective view of PV system 3320 and FIGS. 34 and 35 show close-up details of circles A and B in FIG. 33. Lever clips 2960 or 2460 may be used to connect PV modules 30 to support 3340, though support 3340 is shown without lever clips installed. Support 3140 may be used at the end of a column as shown in FIG. 33. In other embodiments support 3340 may be used throughout.

Figure 36:
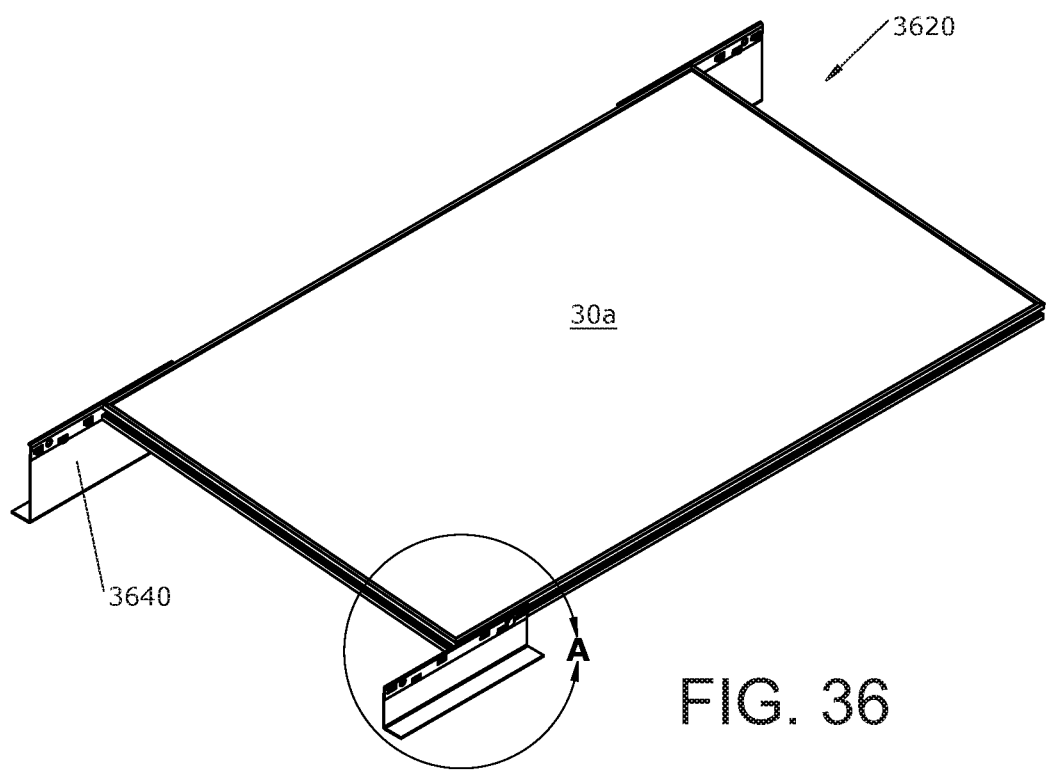
FIG. 36 is a perspective view of an alternate embodiment of a PV array for a flat or low-sloped surface.
Figure 37:
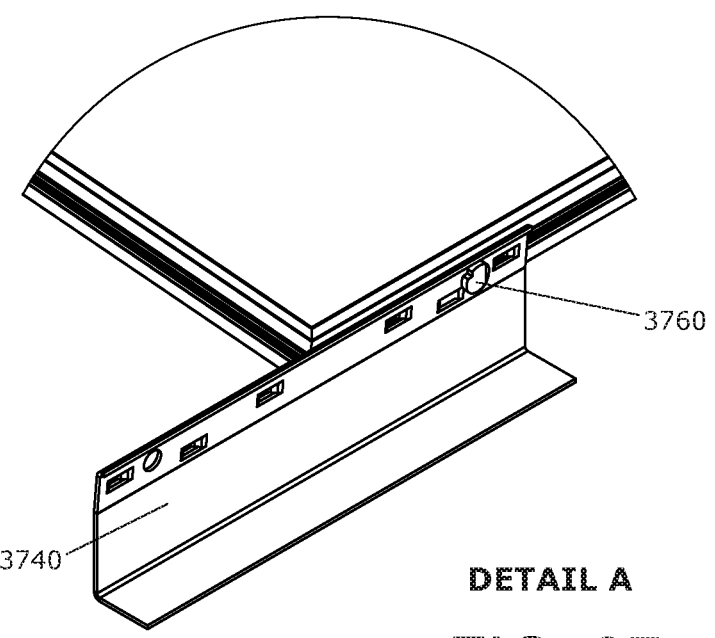
FIG. 37 is an enlarged view of a portion of FIG. 36.

FIGS. 36-37 show an embodiment of a PV system 3620 that is similar to PV system 20 except that supports 40 and lever clips 60 are replaced by rear supports 3640 and front supports 3740. Rear and front supports 3640 and 3740 may be connected to frames 34 via fastener 3760 that may rotate and lock into groove 35.

Figure 38:
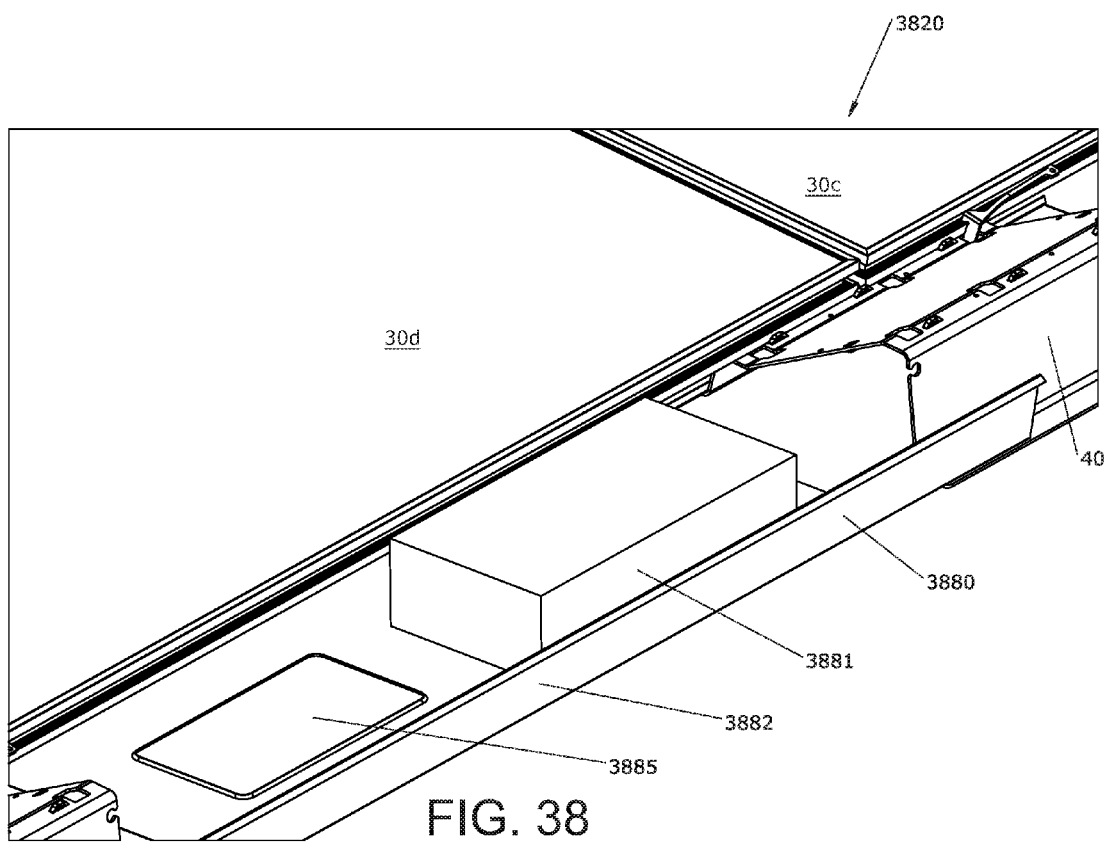
FIG. 38 is a perspective view of a PV array with ballast.
Figure 39:
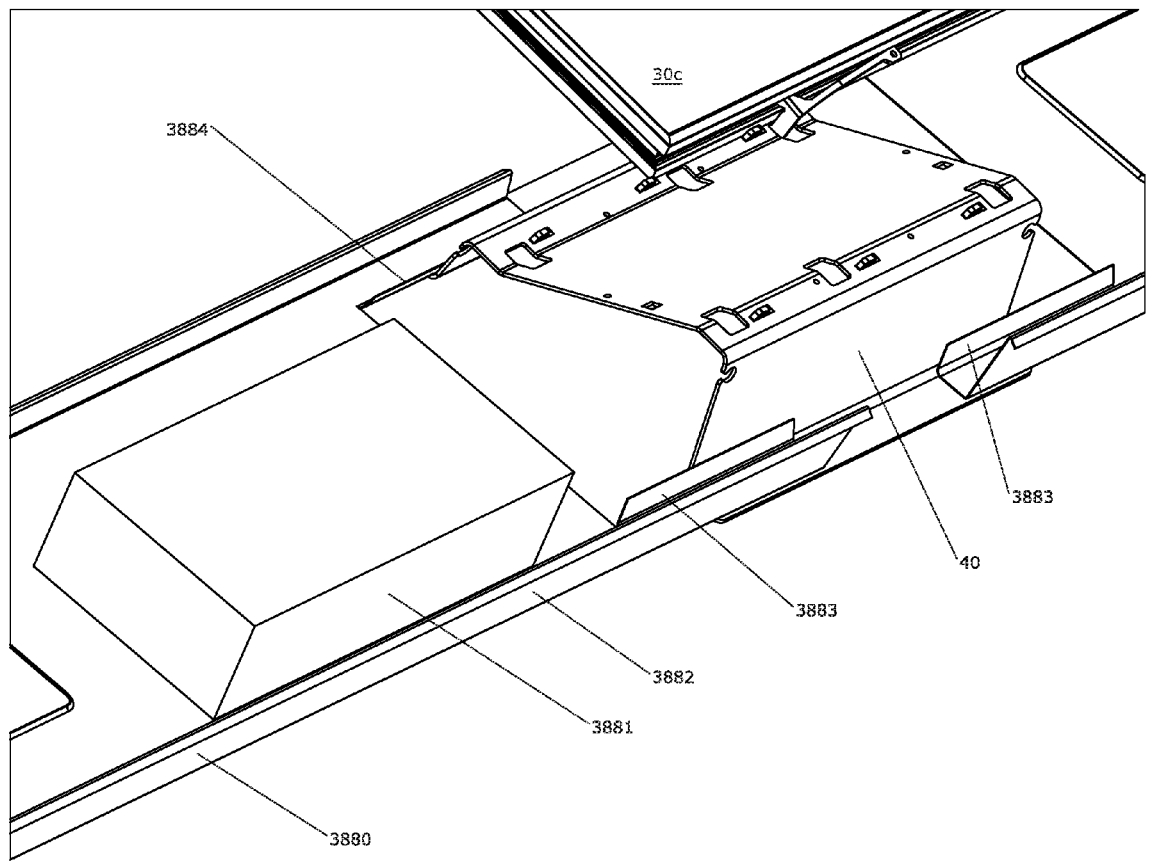
FIG. 39 is another view of a PV array with ballast.

FIGS. 38-39 show perspective views of an embodiment of a PV system 3820 comprising a ballast pan, such as ballast pan 3880, which may be similar to ballast pan 80 except that it may principally extend in the space between, in front of, or behind rows of PV modules 30 instead of, for example, extending beneath PV modules 30. In some embodiments ballast pan 3880 may be used instead of or in addition to ballast pan 80. FIG. 38 shows ballast pan 3880 installed in front of modules 30c, 30d (which are installed on supports 40 with lever clips 60 as described above in FIGS. 1-11). FIG. 38 shows ballast pan 3880 just after installation and before installation of module 30d.

Ballast pan 3880 may comprise walls 3882 for providing stiffness in the z-axis direction and flaps 3883, 3884. Ballast pan 3880 may be installed by sliding straight down and over support 40 into the position shown in FIG. 39. Flaps 3883 and 3884 may interfere with support 40 and thus bend outward to provide a spring load or pre-load between ballast pan 3880 and support 40. Ballast pan 3880 may further comprise cutouts 3885 that leave places to step when an installer may be walking between rows of PV modules 30 in PV system 3820. Ballast blocks 3881 may be placed on top of ballast pan 3880. Walls 3882 may be stiff enough to prevent ballast pan from sagging down and touching roof 10.

Some benefits of PV systems 20, 1220, 1420, 1620, 1820, 2420, 3020, 3320, 3620, 3820 as shown herein may include:
Compatible with many types of roofs and structures;
Simple to install and low part count;
Easy to ship due to nesting of components such as supports;
Few or no tools required for installation since lever clips may be rotated into position by hand;
Good performance in uplift even with hand-installable spring levers due to innovative lever clip design;
Ground bonds created automatically during installation of equipment;
Low cost compared to prior art systems; and
Compatible with grooved PV modules as well as PV modules comprising a substantially flat outward facing surface on the frame.

Other benefits and variations on the features, uses and structures of the various embodiments explicitly disclosed herein may occur to one of skill on the art and are included in this instant disclosure.

Referring now to FIG. 1, a PV array is shown installed upon a flat and level or low-slope surface. A PV array such as PV array 20 may include PV modules 30A-30D, supports 40, ballast pans 80, and vertical walls 82.

Referring now to FIG. 2, an enlarged section of PV array 20 is shown. PV array 20 may further include lever clips 60 and wind deflectors 70. Supports 40 may include an upper surface or pedestal 41, a lower surface or pedestal 44, tabs 42 and openings 43. Lever clips 60 may include a notch 68 and an arm 66. As shown in FIGS. 1 and 2, supports 40 may be arranged on a substantially level or low-slope surfaces such as roof 10 in rows and columns. The distance between neighboring supports 40 in a row may be less than the length of the longest side of a PV module 30. The distance between neighboring supports 40 in a column may be less that the length of the shortest side of a PV module 30. PV modules 30 may be placed on supports 40 such that each corner of the PV module 30 rests on a support 40. The PV module 30 may abut one or more tabs 42, which may align the PV modules 30 on the supports 40 and reduce motion of the PV modules 30 with relation to the supports 40. Clips 60 may engage the frame or a portion of the frame of a PV module 30 and an opening 43 of a support 40 to secure the PV module 30 to the support 40. Clip 60 may penetrate the frame of a PV module 30 and create an electrical grounding bond between the PV module 30, clip 60, and support 40.

Referring now to FIGS. 14 and 15, another embodiment of a PV array is shown installed upon a flat and level or low-slope surface. A PV array such as PV array 1420 is similar to PV array 20 as shown and described in FIG. 1 and others, and to other PV arrays. PV array 1420 may include a bracket such as bracket 1400. Bracket 1400 may connect to PV module 30C and PV module 30A using fasteners 1409, and may further connect to a surface or substrate using a fastener 1405. The bracket 1400, installed, may reduce or eliminate movement or other disruption to the PV array 1420 caused by wind or seismic activity.

While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions, and sub-combinations as are within their true spirit and scope.

What is claimed is:

1. A method for installing photovoltaic modules on a surface comprising the steps of:
    arranging a plurality of supports in one or more rows along an X axis and in one or more columns along a Y axis on a surface, such that in each row a distance between neighboring supports does not exceed a length of a longest side of a photovoltaic module and in each column a distance between neighboring supports does not exceed a length of a shortest side of the photovoltaic module;
    placing the photovoltaic module on the supports, such that each corner of a frame of the photovoltaic module rests on the supports; and
    connecting the supports to the photovoltaic module by engaging a clip to at least a portion of the frame of the photovoltaic module and to the supports,
    wherein each clip flexes to lock the photovoltaic module to one of the supports, and wherein the clip has a head at one end of a spring arm and a catch at the other end of the spring arm, and wherein the head of the clip locks onto both the support and the photovoltaic module and a catch of the clip locks onto the photovoltaic module when the spring arm is flexed;
    thereby providing a secure connection between the photovoltaic module and the supports, creating an upward force and a downward force on the photovoltaic module by way of the clip, creating an electrical grounding bond, thus facilitating the installation process for mounting photovoltaic modules.

2. A method for installing photovoltaic modules on a surface comprising the steps of:
    arranging a plurality of supports in one or more rows along an X axis and one or more columns along a Y axis on a surface, such that in each row a distance between neighboring supports does not exceed a length of a longest side of a PV module and in each column a distance between neighboring supports does not exceed a length of a shortest side of the photovoltaic module;
    placing the photovoltaic module on one or more supports, such that each corner of a frame of the photovoltaic module rests on the supports;
    connecting the supports to the photovoltaic module by engaging a clip to at least a portion of the frame of the photovoltaic module and to the supports, wherein each clip flexes to lock the photovoltaic module to one of the supports, and wherein the clip has a head at one end of a spring arm and a catch at the other end of the spring arm, and wherein the head of the clip has a notch with lips such that a lower lip is received under the photovoltaic module, an upper lip is received within a side groove on the photovoltaic module and the catch of the lever clip is received within the side groove of the photovoltaic module;
    thereby providing a secure connection between the photovoltaic module and the supports, creating an upward force and a downward force on the photovoltaic module by way of the clip, creating an electrical grounding bond, thus facilitating the installation process for mounting photovoltaic modules.

3. A photovoltaic array, comprising:
    (a) supports laid out on a surface in rows and columns;
    (b) photovoltaic modules positioned on top of the supports; and
    (c) lever clips connecting the photovoltaic modules to the supports,
    wherein the supports have an upper pedestal surface and a lower pedestal surface such that the photovoltaic modules are positioned at a non-horizontal angle when edges of the photovoltaic modules are positioned on top of the upper and lower pedestal surfaces, and
    wherein the lever clips flex to lock the photovoltaic modules onto the supports,
    wherein each lever clip has a head at one end of a spring arm and a catch at the other end of the spring arm, and
    wherein the head of the lever clip locks onto both the support and the photovoltaic module and a catch of the lever clip locks onto the photovoltaic module when the spring arm is flexed.

4. The array of claim 3, wherein the corners of two of the photovoltaic modules are positioned on the upper pedestal surface of each of the supports, and the corners of two of the other photovoltaic modules are positioned on the lower pedestal surface of each of the supports.

5. The array of claim 4, wherein four corners of each photovoltaic module are positioned on top of four different supports.

6. The array of claim 3, wherein each lever clip forms an electrical ground bond between one of the photovoltaic modules and one of the supports such that an electrical ground bond is formed across the array.

7. The array of claim 3, wherein each support is a continuous member formed to have an inclined center portion between the upper and lower pedestal surface, and a pair of support flanges formed at the front and back ends of the support.

8. The array of claim 3, wherein the non-horizontal angle is from 2 to 40 degrees.

9. The array of claim 8, wherein the non-horizontal angle is approximately 5 degrees.

10. The array of claim 3, wherein in each row of supports, the distance between two neighboring supports does not exceed the length of the longest side of the module.

11. The array of claim 3, wherein in each column of supports, the distance between two neighboring supports does not exceed the length of the shortest side of the module.

12. The array of claim 3, further comprising wind deflectors attached to the supports, wherein the wind deflectors each comprise a flange spaced apart from the upper edges of the photovoltaic modules so as to leave a pressure equalization air gap between the wind deflectors and the upper edges of the photovoltaic modules.

13. The array of claim 12, wherein the pressure equalization air gaps are located at the apex of the array.

14. A photovoltaic array, comprising:
    (a) supports laid out on a surface in rows and columns;
    (b) photovoltaic modules positioned on top of the supports; and
    (c) lever clips connecting the photovoltaic modules to the supports,
    wherein the supports have an upper pedestal surface and a lower pedestal surface such that the photovoltaic modules are positioned at a non-horizontal angle when edges of the photovoltaic modules are positioned on top of the upper and lower pedestal surfaces, and wherein the lever clips flex to lock the photovoltaic modules onto the supports, wherein each lever clip has a head at one end of a spring arm and a catch at the other end of the spring arm, and wherein the head of the lever clip has a notch with lips such that a lower lip is received under the photovoltaic module, an upper lip is received within a side groove on the photovoltaic module and the catch of the lever clip is received within the side groove of the photovoltaic module.

15. The array of claim 14, wherein the corners of two of the photovoltaic modules are positioned on the upper pedestal surface of each of the supports, and the corners of two of the other photovoltaic modules are positioned on the lower pedestal surface of each of the supports.

16. The array of claim 15, wherein four corners of each photovoltaic module are positioned on top of four different supports.

17. The array of claim 14, wherein each lever clip forms an electrical ground bond between one of the photovoltaic modules and one of the supports such that an electrical ground bond is formed across the array.

18. The array of claim 14, wherein each support is a continuous member formed to have an inclined center portion between the upper and lower pedestal surface, and a pair of support flanges formed at the front and back ends of the support.

19. The array of claim 14, further comprising wind deflectors attached to the supports, wherein the wind deflectors each comprise a flange spaced apart from the upper edges of the photovoltaic modules so as to leave a pressure equalization air gap between the wind deflectors and the upper edges of the photovoltaic modules.

20. The array of claim 14, wherein the pressure equalization air gaps are located at the apex of the array.

21. The array of claim 14, wherein the lower lip of the lever clip is received into an opening adjacent to the upper or lower pedestal surfaces of the support.

* * * * *